(12) United States Patent
Shook

(10) Patent No.: US 6,764,875 B2
(45) Date of Patent: Jul. 20, 2004

(54) METHOD OF AND APPARATUS FOR SEALING AN HERMETIC LID TO A SEMICONDUCTOR DIE

(75) Inventor: James Gill Shook, Santa Cruz, CA (US)

(73) Assignee: Silicon Light Machines, Sunnyvale, CA (US)

( * ) Notice: Subject to any disclaimer, the term of this patent is extended or adjusted under 35 U.S.C. 154(b) by 34 days.

(21) Appl. No.: 09/866,266

(22) Filed: May 24, 2001

(65) Prior Publication Data

US 2001/0022382 A1 Sep. 20, 2001

Related U.S. Application Data

(62) Division of application No. 09/124,710, filed on Jul. 29, 1998, now Pat. No. 6,303,986.

(51) Int. Cl.[7] .............................................. H01L 21/44

(52) U.S. Cl. ...................... 438/106; 438/110; 438/113; 438/116; 257/680; 257/729; 257/730

(58) Field of Search ................................ 438/106, 110, 438/113, 116, 121; 257/680, 729, 730

(56) References Cited

U.S. PATENT DOCUMENTS

| | | |
|---|---|---|
| 1,525,550 A | 2/1925 | Jenkins |
| 1,548,262 A | 8/1925 | Freedman |
| 1,814,701 A | 7/1931 | Ives |
| 2,415,226 A | 2/1947 | Sziklai ........................ 178/5.4 |
| 2,783,406 A | 2/1957 | Vanderhooft .................. 313/70 |
| 2,920,529 A | 1/1960 | Blythe ............................ 88/73 |
| 2,991,690 A | 7/1961 | Grey et al. ................... 88/16.6 |
| 3,256,465 A | 6/1966 | Weissenstern et al. ....... 317/101 |
| 3,388,301 A | 6/1968 | James ........................ 317/234 |
| 3,443,871 A | 5/1969 | Chitayat ..................... 356/106 |
| 3,553,364 A | 1/1971 | Lee .............................. 178/7.3 |
| 3,576,394 A | 4/1971 | Lee .............................. 178/7.3 |
| 3,600,798 A | 8/1971 | Lee ............................... 29/592 |
| 3,656,837 A | 4/1972 | Sandbank .................... 350/161 |
| 3,657,610 A | 4/1972 | Yamamoto et al. .......... 317/234 |
| 3,693,239 A | 9/1972 | Dix .............................. 29/470 |
| 3,743,507 A | 7/1973 | Ih et al. .......................... 96/81 |
| 3,752,563 A | 8/1973 | Torok et al. ................. 350/151 |

(List continued on next page.)

FOREIGN PATENT DOCUMENTS

| | | | |
|---|---|---|---|
| DE | 43 23 799 A1 | 1/1994 | .......... H01L/21/58 |
| EP | 0 089 044 A2 | 9/1983 | .......... H01L/23/10 |
| EP | 0 851 492 A2 | 7/1998 | .......... H01L/23/538 |
| WO | WO 90/13913 | 11/1990 | .......... H01L/23/10 |
| WO | WO 96/02941 | 2/1996 | .......... H01L/23/02 |
| WO | WO 98/05935 | 2/1998 | ............. G01L/9/06 |
| WO | WO 00/07225 | 2/2000 | .......... H01L/21/00 |

*Primary Examiner*—Amir Zarabian
*Assistant Examiner*—Jeff Vockrodt
(74) *Attorney, Agent, or Firm*—Haverstock & Owens LLP

(57) ABSTRACT

A method and apparatus of hermetically passivating a semiconductor device includes sealing a lid directly onto a semiconductor substrate. An active device is formed on the surface of the substrate and is surrounded by a substantially planar lid sealing region, which in turn is surrounded by bonding pads. A first layer of solderable material is formed on the lid sealing region. A lid is provided which has a second layer of solderable material in a configuration corresponding to the first layer. A solder is provided between the first layer and second layer of solderable materials. In the preferred embodiment, the solder is formed over the second layer. Heat is provided to hermetically join the lid to the semiconductor device without requiring a conventional package. Preferably the first and second layers are sandwiches of conventionally known solderable materials which can be processed using conventional semiconductor techniques. An angle between the lid and the semiconductor device can be controlled by adjusting relative widths of one or both the layers of solderable materials.

14 Claims, 8 Drawing Sheets

U.S. PATENT DOCUMENTS

| | | | |
|---|---|---|---|
| 3,781,465 A | 12/1973 | Ernstoff et al. ........ 178/5.4 BD |
| 3,783,184 A | 1/1974 | Ernstoff et al. ........ 178/5.4 BD |
| 3,792,916 A | 2/1974 | Sarna ........................ 350/163 |
| 3,802,769 A | 4/1974 | Rotz et al. .................... 352/43 |
| 3,811,186 A | 5/1974 | Larnerd et al. ............... 29/626 |
| 3,861,784 A | 1/1975 | Torok ..................... 350/162 R |
| 3,862,360 A | 1/1975 | Dill et al. ................. 178/7.3 D |
| 3,871,014 A | 3/1975 | King et al. .................... 357/67 |
| 3,886,310 A | 5/1975 | Guldberg et al. ........ 178/7.5 D |
| 3,896,338 A | 7/1975 | Nathanson et al. ......... 315/373 |
| 3,915,548 A | 10/1975 | Opittek ........................ 350/3.5 |
| 3,935,499 A | 1/1976 | Oess ........................ 313/413 |
| 3,935,500 A | 1/1976 | Oess et al. .................. 313/495 |
| 3,938,881 A | 2/1976 | Biegelsen et al. .......... 350/161 |
| 3,941,456 A | 3/1976 | Schilz et al. ................ 350/161 |
| 3,942,245 A | 3/1976 | Jackson et al. ............... 29/591 |
| 3,943,281 A | 3/1976 | Keller et al. ............. 178/7.5 D |
| 3,947,105 A | 3/1976 | Smith ......................... 353/121 |
| 3,969,611 A | 7/1976 | Fonteneau ................. 219/502 |
| 3,980,476 A | 9/1976 | Wysocki ....................... 96/1.1 |
| 3,991,416 A | 11/1976 | Byles et al. ............. 340/324 R |
| 4,001,663 A | 1/1977 | Bray ............................ 321/2 |
| 4,004,849 A | 1/1977 | Shattuck ................. 350/160 R |
| 4,006,968 A | 2/1977 | Ernstoff et al. ....... 350/160 LC |
| 4,009,939 A | 3/1977 | Okano .................. 350/162 SF |
| 4,011,009 A | 3/1977 | Lama et al. ............ 350/162 R |
| 4,012,116 A | 3/1977 | Yevick ....................... 350/132 |
| 4,012,835 A | 3/1977 | Wallick ....................... 29/591 |
| 4,017,158 A | 4/1977 | Booth .................. 350/162 SF |
| 4,020,381 A | 4/1977 | Oess et al. .................. 313/302 |
| 4,021,766 A | 5/1977 | Aine ............................. 338/2 |
| 4,034,211 A | 7/1977 | Horst et al. .......... 235/61.12 N |
| 4,034,399 A | 7/1977 | Drukier et al. ............... 357/68 |
| 4,035,068 A | 7/1977 | Rawson ..................... 353/122 |
| 4,067,129 A | 1/1978 | Abramson et al. ............ 40/563 |
| 4,084,437 A | 4/1978 | Finnegan ..................... 73/361 |
| 4,090,219 A | 5/1978 | Ernstoff et al. ............... 358/59 |
| 4,093,346 A | 6/1978 | Nishino et al. ......... 350/162 SF |
| 4,093,921 A | 6/1978 | Buss .......................... 325/459 |
| 4,093,922 A | 6/1978 | Buss .......................... 325/459 |
| 4,100,579 A | 7/1978 | Ernstoff ...................... 358/230 |
| 4,103,273 A | 7/1978 | Keller ........................... 338/2 |
| 4,126,380 A | 11/1978 | Borm ........................ 350/266 |
| 4,127,322 A | 11/1978 | Jacobson et al. ............. 353/31 |
| 4,135,502 A | 1/1979 | Peck .......................... 128/76.5 |
| 4,139,257 A | 2/1979 | Matsumoto ................. 350/6.1 |
| 4,143,943 A | 3/1979 | Rawson ..................... 350/120 |
| 4,163,570 A | 8/1979 | Greenaway ................. 283/8 A |
| 4,184,700 A | 1/1980 | Greenaway .................... 283/6 |
| 4,185,891 A | 1/1980 | Kaestner ..................... 350/167 |
| 4,190,855 A | 2/1980 | Inoue .......................... 357/80 |
| 4,195,915 A | 4/1980 | Lichty et al. ............... 350/345 |
| 4,205,428 A | 6/1980 | Ernstoff et al. ........... 29/592 R |
| 4,211,918 A | 7/1980 | Nyfeler et al. ............... 235/454 |
| 4,223,050 A | 9/1980 | Nyfeler et al. ............... 427/163 |
| 4,225,913 A | 9/1980 | Bray .......................... 363/97 |
| 4,249,796 A | 2/1981 | Sincerbox ................... 350/370 |
| 4,250,217 A | 2/1981 | Greenaway ................. 428/161 |
| 4,250,393 A | 2/1981 | Greenaway ................. 250/566 |
| 4,256,787 A | 3/1981 | Shaver et al. ................. 428/1 |
| 4,257,016 A | 3/1981 | Kramer, Jr. et al. ....... 322/7.51 |
| 4,257,053 A | 3/1981 | Gilbreath |
| 4,290,672 A | 9/1981 | Whitefield .................. 350/358 |
| 4,295,145 A | 10/1981 | Latta ......................... 346/108 |
| 4,311,999 A | 1/1982 | Upton et al. ................ 340/755 |
| 4,327,411 A | 4/1982 | Turner ....................... 364/900 |
| 4,327,966 A | 5/1982 | Bloom .................. 350/162 R |
| 4,331,972 A | 5/1982 | Rajchman .................... 358/60 |
| 4,336,982 A | 6/1982 | Rector, Jr. ................. 350/358 |
| 4,338,660 A | 7/1982 | Kelley et al. ............... 364/200 |
| 4,343,535 A | 8/1982 | Bleha, Jr. .................... 350/342 |
| 4,346,965 A | 8/1982 | Spraque et al. ............. 350/358 |
| 4,348,079 A | 9/1982 | Johnson ..................... 350/358 |
| 4,355,463 A | 10/1982 | Burns .......................... 29/827 |
| 4,361,384 A | 11/1982 | Bosserman ................. 350/174 |
| 4,369,524 A | 1/1983 | Rawson et al. ............. 455/606 |
| 4,374,397 A | 2/1983 | Mir ............................ 358/75 |
| 4,389,096 A | 6/1983 | Hori et al. ............. 350/339 R |
| 4,391,490 A | 7/1983 | Hartke ....................... 350/356 |
| 4,396,246 A | 8/1983 | Holman ................. 350/96.14 |
| 4,398,798 A | 8/1983 | Krawczak et al. ..... 350/162.24 |
| 4,400,740 A | 8/1983 | Traino et al. ............... 358/293 |
| 4,408,884 A | 10/1983 | Kleinknecht et al. ....... 356/355 |
| 4,414,583 A | 11/1983 | Hooker, III ................. 358/300 |
| 4,417,386 A | 11/1983 | Exner .......................... 29/590 |
| 4,418,397 A | 11/1983 | Brantingham et al. ...... 364/900 |
| 4,420,717 A | 12/1983 | Wallace et al. ............. 318/696 |
| 4,422,099 A | 12/1983 | Wolfe ........................ 358/293 |
| 4,426,768 A | 1/1984 | Black et al. ................. 29/583 |
| 4,430,584 A | 2/1984 | Someshwar et al. ........ 307/465 |
| 4,435,041 A | 3/1984 | Torok et al. ........... 350/162.24 |
| 4,440,839 A | 4/1984 | Mottier ........................ 430/2 |
| 4,443,819 A | 4/1984 | Funada et al. ............. 358/236 |
| 4,443,845 A | 4/1984 | Hamilton et al. ........... 364/200 |
| 4,447,881 A | 5/1984 | Brantingham et al. ...... 364/488 |
| 4,454,591 A | 6/1984 | Lou .......................... 364/900 |
| 4,456,338 A | 6/1984 | Gelbart ...................... 350/358 |
| 4,460,907 A | 7/1984 | Nelson ................... 346/153.1 |
| 4,462,046 A | 7/1984 | Spight ........................ 358/101 |
| 4,467,342 A | 8/1984 | Tower ......................... 357/30 |
| 4,468,725 A | 8/1984 | Venturini ................... 363/160 |
| 4,483,596 A | 11/1984 | Marshall .................... 350/385 |
| 4,484,188 A | 11/1984 | Ott ............................. 340/728 |
| 4,487,677 A | 12/1984 | Murphy ..................... 204/247 |
| 4,492,435 A | 1/1985 | Banton et al. .............. 350/360 |
| 4,503,494 A | 3/1985 | Hamilton et al. ........... 364/200 |
| 4,511,220 A | 4/1985 | Scully ........................ 350/403 |
| 4,538,883 A | 9/1985 | Sprague et al. ............. 350/356 |
| 4,545,610 A | 10/1985 | Lakritz et al. ................ 29/589 |
| 4,556,378 A | 12/1985 | Nyfeler et al. .............. 425/143 |
| 4,558,171 A | 12/1985 | Gantley et al. .......... 174/52 FP |
| 4,561,011 A | 12/1985 | Kohara et al. |
| 4,561,044 A | 12/1985 | Ogura et al. .................. 362/84 |
| 4,566,935 A | 1/1986 | Hornbeck ................... 156/626 |
| 4,567,585 A | 1/1986 | Gelbart ........................ 369/97 |
| 4,571,041 A | 2/1986 | Gaudyn ....................... 353/10 |
| 4,571,603 A | 2/1986 | Hornbeck et al. .......... 346/160 |
| 4,577,932 A | 3/1986 | Gelbart ...................... 350/358 |
| 4,577,933 A | 3/1986 | Yip et al. ................... 350/358 |
| 4,588,957 A | 5/1986 | Balant et al. ................ 330/4.3 |
| 4,590,548 A | 5/1986 | Maytum ..................... 363/161 |
| 4,594,501 A | 6/1986 | Culley et al. ............... 219/492 |
| 4,596,992 A | 6/1986 | Hornbeck ............... 346/76 PH |
| 4,615,595 A | 10/1986 | Hornbeck ................... 353/122 |
| 4,623,219 A | 11/1986 | Trias ......................... 350/351 |
| 4,636,039 A | 1/1987 | Turner ....................... 350/356 |
| 4,636,866 A | 1/1987 | Hattori ....................... 358/236 |
| 4,641,193 A | 2/1987 | Glenn ........................ 358/233 |
| 4,645,881 A | 2/1987 | LeToumelin et al. ........ 379/252 |
| 4,646,158 A | 2/1987 | Ohno et al. ................. 358/236 |
| 4,649,085 A | 3/1987 | Landram .................... 428/620 |
| 4,649,432 A | 3/1987 | Watanabe et al. ........... 358/241 |
| 4,652,932 A | 3/1987 | Miyajima et al. ........... 358/236 |
| 4,655,539 A | 4/1987 | Caulfield et al. ............. 350/3.6 |
| 4,660,938 A | 4/1987 | Kazan ........................ 350/355 |
| 4,661,828 A | 4/1987 | Miller, Jr. et al. ........... 346/108 |
| 4,662,746 A | 5/1987 | Hornbeck ................... 350/269 |
| 4,663,670 A | 5/1987 | Ito et al. ..................... 358/245 |
| 4,687,326 A | 8/1987 | Corby, Jr. ...................... 356/5 |
| 4,698,602 A | 10/1987 | Armitage ................... 332/7.51 |
| 4,700,276 A | 10/1987 | Freyman et al. ............ 361/403 |

| | | | |
|---|---|---|---|
| 4,707,064 A | 11/1987 | Dobrowolski et al. ... 350/96.19 |
| 4,709,995 A | 12/1987 | Kuribayashi et al. ....... 350/350 |
| 4,710,732 A | 12/1987 | Hornbeck .................. 332/7.51 |
| 4,711,526 A | 12/1987 | Hennings et al. ........... 350/170 |
| 4,714,326 A | 12/1987 | Usui et al. .................. 350/485 |
| 4,717,066 A | 1/1988 | Goldenberg et al. ........ 228/179 |
| 4,719,507 A | 1/1988 | Bos ............................. 358/92 |
| 4,721,629 A | 1/1988 | Sakai et al. .................. 427/35 |
| 4,722,593 A | 2/1988 | Shimazaki ................... 350/336 |
| 4,724,467 A | 2/1988 | Yip et al. ...................... 355/71 |
| 4,728,185 A | 3/1988 | Thomas ..................... 353/122 |
| 4,743,091 A | 5/1988 | Gelbart ...................... 350/252 |
| 4,744,633 A | 5/1988 | Sheiman ..................... 350/132 |
| 4,747,671 A | 5/1988 | Takahashi et al. .......... 350/336 |
| 4,751,509 A | 6/1988 | Kubota et al. ............... 340/784 |
| 4,761,253 A | 8/1988 | Antes ........................ 264/1.3 |
| 4,763,975 A | 8/1988 | Scifres et al. ............. 350/96.15 |
| 4,765,865 A | 8/1988 | Gealer et al. ................ 156/647 |
| 4,772,094 A | 9/1988 | Sheiman ..................... 350/133 |
| 4,797,694 A | 1/1989 | Agostinelli et al. ......... 346/160 |
| 4,797,918 A | 1/1989 | Lee et al. ...................... 380/20 |
| 4,801,194 A | 1/1989 | Agostinelli et al. ......... 350/356 |
| 4,803,560 A | 2/1989 | Matsunaga et al. ......... 359/236 |
| 4,804,641 A | 2/1989 | Arlt et al. .................... 437/227 |
| 4,807,021 A | 2/1989 | Okumura ...................... 357/75 |
| 4,807,965 A | 2/1989 | Garakani .................... 350/131 |
| 4,809,078 A | 2/1989 | Yabe et al. .................. 358/236 |
| 4,811,082 A | 3/1989 | Jacobs et al. ................. 357/80 |
| 4,811,210 A | 3/1989 | McAulay .................... 364/200 |
| 4,814,759 A | 3/1989 | Gombrich et al. .......... 340/771 |
| 4,817,850 A | 4/1989 | Wiener-Avnear et al. ... 228/119 |
| 4,824,200 A | 4/1989 | Isono et al. ............... 350/96.16 |
| 4,827,391 A | 5/1989 | Sills .............................. 363/41 |
| 4,829,365 A | 5/1989 | Eichenlaub ................... 358/3 |
| 4,836,649 A | 6/1989 | Ledebuhr et al. ........ 350/331 R |
| 4,856,863 A | 8/1989 | Sampsell et al. ........ 350/96.16 |
| 4,856,869 A | 8/1989 | Sakata et al. .......... 350/162.18 |
| 4,859,012 A | 8/1989 | Cohn ....................... 350/96.24 |
| 4,859,060 A | 8/1989 | Katagiri et al. ............. 356/352 |
| 4,866,488 A | 9/1989 | Frensley ........................ 357/4 |
| 4,882,683 A | 11/1989 | Rupp et al. ................. 364/521 |
| 4,893,509 A | 1/1990 | MacIver et al. ........ 73/517 AV |
| 4,896,325 A | 1/1990 | Coldren ........................ 372/20 |
| 4,896,948 A | 1/1990 | Dono et al. ................. 350/355 |
| 4,897,708 A | 1/1990 | Clements ..................... 357/65 |
| 4,902,083 A | 2/1990 | Wells ......................... 350/6.6 |
| 4,915,463 A | 4/1990 | Barbee, Jr. .................. 350/1.1 |
| 4,915,479 A | 4/1990 | Clarke ........................ 350/345 |
| 4,924,413 A | 5/1990 | Suwannukul ............... 364/521 |
| 4,926,241 A | 5/1990 | Carey ........................... 357/75 |
| 4,930,043 A | 5/1990 | Wiegand ..................... 361/283 |
| 4,934,773 A | 6/1990 | Becker ........................ 350/6.6 |
| 4,940,309 A | 7/1990 | Baum .......................... 350/171 |
| 4,943,815 A | 7/1990 | Aldrich et al. .............. 346/108 |
| 4,945,773 A | 8/1990 | Sickafus ................... 73/862.59 |
| 4,949,148 A | 8/1990 | Bartelink ...................... 357/74 |
| 4,950,890 A | 8/1990 | Gelbart .................. 250/237 G |
| 4,952,925 A | 8/1990 | Haastert ....................... 340/784 |
| 4,954,789 A | 9/1990 | Sampsell .................... 330/4.3 |
| 4,956,619 A | 9/1990 | Hornbeck .................... 330/4.3 |
| 4,961,633 A | 10/1990 | Ibrahim et al. .............. 350/392 |
| 4,963,012 A | 10/1990 | Tracy et al. ................. 350/641 |
| 4,970,575 A | 11/1990 | Soga et al. .................... 357/72 |
| 4,978,202 A | 12/1990 | Yang ..................... 350/331 R |
| 4,982,184 A | 1/1991 | Kirkwood ................... 340/784 |
| 4,982,265 A | 1/1991 | Watanabe et al. ............. 357/75 |
| 4,984,824 A | 1/1991 | Antes et al. ................... 283/91 |
| 4,999,308 A | 3/1991 | Nishiura et al. ............... 437/4 |
| 5,003,300 A | 3/1991 | Wells ......................... 340/705 |
| 5,009,473 A | 4/1991 | Hunter et al. ................ 350/6.6 |
| 5,013,141 A | 5/1991 | Sakata ........................ 350/348 |
| 5,018,256 A | 5/1991 | Hornbeck .................. 29/25.01 |
| 5,022,750 A | 6/1991 | Flasck .......................... 353/31 |
| 5,023,905 A | 6/1991 | Wells et al. .................. 379/96 |
| 5,024,494 A | 6/1991 | Williams et al. ............. 350/3.6 |
| 5,028,939 A | 7/1991 | Hornbeck et al. .......... 346/160 |
| 5,031,144 A | 7/1991 | Persky |
| 5,035,473 A | 7/1991 | Kuwayama et al. ......... 350/3.7 |
| 5,037,173 A | 8/1991 | Sampsell et al. ............. 385/17 |
| 5,039,628 A | 8/1991 | Carey .......................... 437/183 |
| 5,040,052 A | 8/1991 | McDavid ..................... 357/80 |
| 5,041,395 A | 8/1991 | Steffen ....................... 437/206 |
| 5,041,851 A | 8/1991 | Nelson ........................ 346/160 |
| 5,043,917 A | 8/1991 | Okamoto .................... 364/518 |
| 5,048,077 A | 9/1991 | Wells et al. .................. 379/96 |
| 5,049,901 A | 9/1991 | Gelbart ....................... 346/108 |
| 5,058,992 A | 10/1991 | Takahashi ................... 359/567 |
| 5,060,058 A | 10/1991 | Goldenberg et al. .......... 358/60 |
| 5,061,049 A | 10/1991 | Hornbeck .................... 359/224 |
| 5,066,614 A | 11/1991 | Dunnaway et al. ......... 437/209 |
| 5,068,205 A | 11/1991 | Baxter et al. ................ 437/205 |
| 5,072,239 A | 12/1991 | Mitcham et al. ............ 346/108 |
| 5,072,418 A | 12/1991 | Boutaud et al. ........ 364/715.06 |
| 5,074,947 A | 12/1991 | Estes et al. ............... 156/307.3 |
| 5,075,940 A | 12/1991 | Kuriyama et al. ......... 29/25.03 |
| 5,079,544 A | 1/1992 | DeMond et al. ............. 340/701 |
| 5,081,617 A | 1/1992 | Gelbart ....................... 369/112 |
| 5,083,857 A | 1/1992 | Hornbeck .................... 359/291 |
| 5,085,497 A | 2/1992 | Um et al. .................... 359/848 |
| 5,089,903 A | 2/1992 | Kuwayama et al. .......... 359/15 |
| 5,093,281 A | 3/1992 | Eshima ....................... 437/217 |
| 5,096,279 A | 3/1992 | Hornbeck et al. .......... 359/230 |
| 5,099,353 A | 3/1992 | Hornbeck .................... 359/291 |
| 5,101,184 A | 3/1992 | Antes ......................... 235/454 |
| 5,101,236 A | 3/1992 | Nelson et al. ............... 355/229 |
| 5,103,334 A | 4/1992 | Swanberg ................... 359/197 |
| 5,105,207 A | 4/1992 | Nelson ........................ 346/160 |
| 5,105,299 A | 4/1992 | Anderson et al. ........... 359/223 |
| 5,105,369 A | 4/1992 | Nelson ........................ 364/525 |
| 5,107,372 A | 4/1992 | Gelbart et al. .............. 359/824 |
| 5,112,436 A | 5/1992 | Bol ............................. 156/643 |
| 5,113,272 A | 5/1992 | Reamey ....................... 359/53 |
| 5,113,285 A | 5/1992 | Franklin et al. ............. 359/465 |
| 5,115,344 A | 5/1992 | Jaskie ......................... 359/573 |
| 5,119,204 A | 6/1992 | Hashimoto et al. ......... 358/254 |
| 5,121,343 A | 6/1992 | Faris ........................... 395/111 |
| 5,126,812 A | 6/1992 | Greiff ........................... 357/25 |
| 5,126,826 A | 6/1992 | Kauchi et al. ................. 357/72 |
| 5,126,836 A | 6/1992 | Um ............................... 358/60 |
| 5,128,660 A | 7/1992 | DeMond et al. ............. 340/707 |
| 5,129,716 A | 7/1992 | Holakovszky et al. ........ 351/50 |
| 5,132,723 A | 7/1992 | Gelbart ......................... 355/40 |
| 5,132,812 A | 7/1992 | Takahashi et al. ............. 359/9 |
| 5,136,695 A | 8/1992 | Goldshlag et al. .......... 395/275 |
| 5,137,836 A | 8/1992 | Lam ............................. 437/8 |
| 5,142,303 A | 8/1992 | Nelson ........................ 346/108 |
| 5,142,405 A | 8/1992 | Hornbeck .................... 359/226 |
| 5,142,677 A | 8/1992 | Ehlig et al. .................. 395/650 |
| 5,144,472 A | 9/1992 | Sang, Jr. et al. ............. 359/254 |
| 5,147,815 A | 9/1992 | Casto ............................ 437/51 |
| 5,148,157 A | 9/1992 | Florence ..................... 340/783 |
| 5,148,506 A | 9/1992 | McDonald .................. 385/16 |
| 5,149,405 A | 9/1992 | Bruns et al. .............. 204/129.1 |
| 5,150,205 A | 9/1992 | Um et al. ..................... 358/60 |
| 5,151,718 A | 9/1992 | Nelson ........................ 346/160 |
| 5,151,724 A | 9/1992 | Kikinis ......................... 357/17 |
| 5,151,763 A | 9/1992 | Marek et al. .................. 357/26 |
| 5,153,770 A | 10/1992 | Harris ......................... 359/245 |
| 5,155,604 A | 10/1992 | Miekka et al. ................ 359/2 |
| 5,155,615 A | 10/1992 | Tagawa ....................... 359/213 |
| 5,155,778 A | 10/1992 | Magel et al. .................. 385/18 |
| 5,155,812 A | 10/1992 | Ehlig et al. .................. 395/275 |

| Patent | | Date | Inventor | Class |
|---|---|---|---|---|
| 5,157,304 | A * | 10/1992 | Kane et al. | 220/2.1 R |
| 5,159,485 | A | 10/1992 | Nelson | 359/291 |
| 5,161,042 | A | 11/1992 | Hamada | 359/41 |
| 5,162,787 | A | 11/1992 | Thompson et al. | 340/794 |
| 5,164,019 | A | 11/1992 | Sinton | 136/249 |
| 5,165,013 | A | 11/1992 | Faris | 395/104 |
| 5,168,401 | A | 12/1992 | Endriz | 359/625 |
| 5,168,406 | A | 12/1992 | Nelson | 359/855 |
| 5,170,156 | A | 12/1992 | DeMond et al. | 340/794 |
| 5,170,269 | A | 12/1992 | Lin et al. | 359/9 |
| 5,170,283 | A | 12/1992 | O'Brien et al. | 359/291 |
| 5,172,161 | A | 12/1992 | Nelson | 355/200 |
| 5,172,262 | A | 12/1992 | Hornbeck | 359/223 |
| 5,177,724 | A | 1/1993 | Gelbart | 369/44.16 |
| 5,178,728 | A | 1/1993 | Boysel et al. | 156/656 |
| 5,179,274 | A | 1/1993 | Sampsell | 250/208.2 |
| 5,179,367 | A | 1/1993 | Shimizu | 340/700 |
| 5,181,231 | A | 1/1993 | Parikh et al. | 377/26 |
| 5,182,665 | A | 1/1993 | O'Callaghan et al. | 359/95 |
| 5,185,660 | A | 2/1993 | Um | 358/60 |
| 5,185,823 | A | 2/1993 | Kaku et al. | |
| 5,188,280 | A | 2/1993 | Nakao et al. | 228/123 |
| 5,189,404 | A | 2/1993 | Masimo et al. | 340/720 |
| 5,189,505 | A | 2/1993 | Bartelink | 257/419 |
| 5,191,405 | A | 3/1993 | Tomita et al. | 257/777 |
| 5,192,864 | A | 3/1993 | McEwen et al. | 250/234 |
| 5,192,946 | A | 3/1993 | Thompson et al. | 340/794 |
| 5,198,895 | A | 3/1993 | Vick | 358/103 |
| 5,202,785 | A | 4/1993 | Nelson | 359/214 |
| 5,206,629 | A | 4/1993 | DeMond et al. | 340/719 |
| 5,206,829 | A | 4/1993 | Thakoor et al. | |
| 5,208,818 | A | 5/1993 | Gelbart et al. | 372/30 |
| 5,208,891 | A | 5/1993 | Prysner | 385/116 |
| 5,210,637 | A | 5/1993 | Puzey | 359/263 |
| 5,212,115 | A | 5/1993 | Cho et al. | 437/208 |
| 5,212,555 | A | 5/1993 | Stoltz | 358/206 |
| 5,212,582 | A | 5/1993 | Nelson | 359/224 |
| 5,214,308 | A | 5/1993 | Nishiguchi et al. | 257/692 |
| 5,214,419 | A | 5/1993 | DeMond et al. | 340/794 |
| 5,214,420 | A | 5/1993 | Thompson et al. | 340/795 |
| 5,216,278 | A | 6/1993 | Lin et al. | |
| 5,216,537 | A | 6/1993 | Hornbeck | 359/291 |
| 5,216,544 | A | 6/1993 | Horikawa et al. | 359/622 |
| 5,219,794 | A | 6/1993 | Satoh et al. | 437/209 |
| 5,220,200 | A | 6/1993 | Blanton | 257/778 |
| 5,221,400 | A | 6/1993 | Staller et al. | 156/292 |
| 5,221,982 | A | 6/1993 | Faris | 359/93 |
| 5,224,088 | A | 6/1993 | Atiya | 369/97 |
| 5,226,099 | A | 7/1993 | Mignardi et al. | 385/19 |
| 5,229,597 | A | 7/1993 | Fukatsu | |
| 5,230,005 | A | 7/1993 | Rubino et al. | 372/20 |
| 5,231,363 | A | 7/1993 | Sano et al. | 332/109 |
| 5,231,388 | A | 7/1993 | Stoltz | 340/783 |
| 5,231,432 | A | 7/1993 | Glenn | 353/31 |
| 5,233,456 | A | 8/1993 | Nelson | 359/214 |
| 5,233,460 | A | 8/1993 | Partlo et al. | 359/247 |
| 5,233,874 | A | 8/1993 | Putty et al. | 73/517 AV |
| 5,237,340 | A | 8/1993 | Nelson | 346/108 |
| 5,237,435 | A | 8/1993 | Kurematsu et al. | 359/41 |
| 5,239,448 | A | 8/1993 | Perkins et al. | 361/764 |
| 5,239,806 | A | 8/1993 | Maslakow | 53/432 |
| 5,240,818 | A | 8/1993 | Mignardi et al. | 430/321 |
| 5,245,686 | A | 9/1993 | Faris et al. | 385/120 |
| 5,247,180 | A | 9/1993 | Mitcham et al. | 250/492.1 |
| 5,247,593 | A | 9/1993 | Lin et al. | 385/17 |
| 5,249,245 | A | 9/1993 | Lebby et al. | 385/89 |
| 5,251,057 | A | 10/1993 | Guerin et al. | 359/249 |
| 5,251,058 | A | 10/1993 | MacArthur | 359/249 |
| 5,254,980 | A | 10/1993 | Hendrix et al. | 345/84 |
| 5,255,100 | A | 10/1993 | Urbanus | 358/231 |
| 5,256,869 | A | 10/1993 | Lin et al. | 250/201.9 |
| 5,258,325 | A | 11/1993 | Spitzer et al. | 437/86 |
| 5,260,718 | A | 11/1993 | Rommelmann et al. | 346/107 R |
| 5,260,798 | A | 11/1993 | Um et al. | 358/233 |
| 5,262,000 | A | 11/1993 | Welbourn et al. | 156/643 |
| 5,272,473 | A | 12/1993 | Thompson et al. | 345/7 |
| 5,278,652 | A | 1/1994 | Urbanus et al. | 358/160 |
| 5,278,925 | A | 1/1994 | Boysel et al. | 385/14 |
| 5,280,277 | A | 1/1994 | Hornbeck | 345/108 |
| 5,281,887 | A | 1/1994 | Engle | 310/335 |
| 5,281,957 | A | 1/1994 | Schoolman | 345/8 |
| 5,285,105 | A | 2/1994 | Cain | 257/672 |
| 5,285,196 | A | 2/1994 | Gale, Jr. | 345/108 |
| 5,285,407 | A | 2/1994 | Gale et al. | 365/189.11 |
| 5,287,096 | A | 2/1994 | Thompson et al. | 345/147 |
| 5,287,215 | A | 2/1994 | Warde et al. | 359/293 |
| 5,289,172 | A | 2/1994 | Gale, Jr. et al. | 345/108 |
| 5,291,317 | A | 3/1994 | Newswanger | 359/15 |
| 5,291,473 | A | 3/1994 | Pauli | 369/112 |
| 5,293,511 | A | 3/1994 | Poradish et al. | 257/434 |
| 5,296,408 | A | 3/1994 | Wilbarg et al. | 437/203 |
| 5,296,891 | A | 3/1994 | Vogt et al. | 355/67 |
| 5,296,950 | A | 3/1994 | Lin et al. | 359/9 |
| 5,298,460 | A | 3/1994 | Nishiguchi et al. | 437/183 |
| 5,299,037 | A | 3/1994 | Sakata | 359/41 |
| 5,299,289 | A | 3/1994 | Omae et al. | 359/95 |
| 5,300,813 | A | 4/1994 | Joshi et al. | 257/752 |
| 5,301,062 | A | 4/1994 | Takahashi et al. | 359/567 |
| 5,303,043 | A | 4/1994 | Glenn | 348/40 |
| 5,303,055 | A | 4/1994 | Hendrix et al. | 348/761 |
| 5,307,056 | A | 4/1994 | Urbanus | 340/189 |
| 5,307,185 | A | 4/1994 | Jones et al. | 359/41 |
| 5,310,624 | A | 5/1994 | Ehrlich | 430/322 |
| 5,311,349 | A | 5/1994 | Anderson et al. | 359/223 |
| 5,311,360 | A | 5/1994 | Bloom et al. | 359/572 |
| 5,312,513 | A | 5/1994 | Florence et al. | 156/643 |
| 5,313,479 | A | 5/1994 | Florence | 372/26 |
| 5,313,648 | A | 5/1994 | Ehlig et al. | 395/800 |
| 5,313,835 | A | 5/1994 | Dunn | 73/505 |
| 5,315,418 | A | 5/1994 | Sprague et al. | 359/41 |
| 5,315,423 | A | 5/1994 | Hong | 359/124 |
| 5,315,429 | A | 5/1994 | Abramov | |
| 5,319,214 | A | 6/1994 | Gregory et al. | 250/504 R |
| 5,319,668 | A | 6/1994 | Luecke | 372/107 |
| 5,319,789 | A | 6/1994 | Ehlig et al. | 395/800 |
| 5,319,792 | A | 6/1994 | Ehlig et al. | 395/800 |
| 5,320,709 | A | 6/1994 | Bowden et al. | |
| 5,321,416 | A | 6/1994 | Bassett et al. | 345/8 |
| 5,323,002 | A | 6/1994 | Sampsell et al. | 250/252.1 |
| 5,323,051 | A | 6/1994 | Adams et al. | 257/417 |
| 5,325,116 | A | 6/1994 | Sampsell | 346/108 |
| 5,327,286 | A | 7/1994 | Sampsell et al. | 359/561 |
| 5,329,289 | A | 7/1994 | Sakamoto et al. | 345/126 |
| 5,330,301 | A | 7/1994 | Brancher | 414/417 |
| 5,330,878 | A | 7/1994 | Nelson | 430/311 |
| 5,331,454 | A | 7/1994 | Hornbeck | 359/224 |
| 5,334,991 | A | 8/1994 | Wells et al. | 345/8 |
| 5,339,116 | A | 8/1994 | Urbanus et al. | 348/716 |
| 5,339,177 | A | 8/1994 | Jenkins et al. | 359/35 |
| 5,340,772 | A | 8/1994 | Rosotker | 437/226 |
| 5,345,521 | A | 9/1994 | McDonald et al. | 385/19 |
| 5,347,321 | A | 9/1994 | Gove | 348/663 |
| 5,347,378 | A | 9/1994 | Handschy et al. | 359/53 |
| 5,347,433 | A | 9/1994 | Sedlmayr | 362/32 |
| 5,348,619 | A | 9/1994 | Bohannon et al. | 156/664 |
| 5,349,687 | A | 9/1994 | Ehlig et al. | 395/800 |
| 5,351,052 | A | 9/1994 | D'Hont et al. | 342/42 |
| 5,352,926 | A | 10/1994 | Andrews | 257/717 |
| 5,354,416 | A | 10/1994 | Okudaira | 156/643 |
| 5,357,369 | A | 10/1994 | Pilling et al. | 359/462 |
| 5,357,803 | A | 10/1994 | Lane | 73/517 B |
| 5,359,349 | A | 10/1994 | Jambor et al. | 345/168 |

| Patent | Date | Inventor | Class |
|---|---|---|---|
| 5,359,451 A | 10/1994 | Gelbart et al. | 359/285 |
| 5,361,131 A | 11/1994 | Tekemori et al. | 356/355 |
| 5,363,220 A | 11/1994 | Kuwayama et al. | 359/3 |
| 5,365,283 A | 11/1994 | Doherty et al. | 348/743 |
| 5,367,585 A | 11/1994 | Ghezzo et al. | 385/23 |
| 5,371,543 A | 12/1994 | Anderson | 348/270 |
| 5,371,618 A | 12/1994 | Tai et al. | 359/53 |
| 5,382,961 A | 1/1995 | Gale, Jr. | 345/108 |
| 5,387,924 A | 2/1995 | Gale, Jr. et al. | 345/108 |
| 5,389,182 A | 2/1995 | Mignardi | 156/344 |
| 5,391,881 A | 2/1995 | Jeuch et al. | 250/370.09 |
| 5,392,140 A | 2/1995 | Ezra et al. | 359/41 |
| 5,392,151 A | 2/1995 | Nelson | 359/223 |
| 5,394,303 A | 2/1995 | Yamaji | 361/749 |
| 5,398,071 A | 3/1995 | Gove et al. | 348/558 |
| 5,399,898 A | 3/1995 | Rostoker | 257/499 |
| 5,404,365 A | 4/1995 | Hiiro | 372/27 |
| 5,404,485 A | 4/1995 | Ban | 395/425 |
| 5,408,123 A | 4/1995 | Murai | 257/531 |
| 5,410,315 A | 4/1995 | Huber | 342/42 |
| 5,411,769 A | 5/1995 | Hornbeck | 427/534 |
| 5,412,186 A | 5/1995 | Gale | 219/679 |
| 5,412,501 A | 5/1995 | Fisli | 359/286 |
| 5,418,584 A | 5/1995 | Larson | 353/122 |
| 5,420,655 A | 5/1995 | Shimizu | 353/33 |
| 5,420,722 A | 5/1995 | Bielak | 359/708 |
| 5,426,072 A | 6/1995 | Finnila | 437/208 |
| 5,427,975 A | 6/1995 | Sparks et al. | 437/79 |
| 5,430,524 A | 7/1995 | Nelson | 355/200 |
| 5,435,876 A | 7/1995 | Alfaro et al. | 156/247 |
| 5,438,477 A | 8/1995 | Pasch | 361/689 |
| 5,439,731 A | 8/1995 | Li et al. | 428/209 |
| 5,442,411 A | 8/1995 | Urbanus et al. | 348/771 |
| 5,442,414 A | 8/1995 | Janssen et al. | 353/98 |
| 5,444,566 A | 8/1995 | Gale et al. | 359/291 |
| 5,445,559 A | 8/1995 | Gale et al. | 451/388 |
| 5,446,479 A | 8/1995 | Thompson et al. | 345/139 |
| 5,447,600 A | 9/1995 | Webb | 216/2 |
| 5,448,314 A | 9/1995 | Heimbuch et al. | 348/743 |
| 5,448,546 A | 9/1995 | Pauli | 369/112 |
| 5,450,088 A | 9/1995 | Meier et al. | 342/51 |
| 5,450,219 A | 9/1995 | Gold et al. | 359/40 |
| 5,451,103 A | 9/1995 | Hatanaka et al. | 353/31 |
| 5,452,024 A | 9/1995 | Sampsell | 348/755 |
| 5,452,138 A | 9/1995 | Mignardi et al. | 359/855 |
| 5,453,747 A | 9/1995 | D'Hont et al. | 342/42 |
| 5,453,778 A | 9/1995 | Venkateswar et al. | 347/239 |
| 5,453,803 A | 9/1995 | Shapiro et al. | 353/119 |
| 5,454,160 A | 10/1995 | Nickel | 29/840 |
| 5,454,906 A | 10/1995 | Baker et al. | 216/66 |
| 5,455,445 A | 10/1995 | Kurtz et al. | 257/419 |
| 5,455,455 A | 10/1995 | Badehi | 257/690 |
| 5,455,602 A | 10/1995 | Tew | 347/239 |
| 5,457,493 A | 10/1995 | Leddy et al. | 348/164 |
| 5,457,566 A | 10/1995 | Sampsell et al. | 359/292 |
| 5,457,567 A | 10/1995 | Shinohara | 359/305 |
| 5,458,716 A | 10/1995 | Alfaro et al. | 156/245 |
| 5,459,492 A | 10/1995 | Venkateswar | 347/253 |
| 5,459,528 A | 10/1995 | Pettitt | 348/568 |
| 5,459,592 A | 10/1995 | Shibatani et al. | 359/40 |
| 5,459,610 A | 10/1995 | Bloom et al. | 359/572 |
| 5,461,197 A | 10/1995 | Hiruta et al. | 174/52.4 |
| 5,461,410 A | 10/1995 | Venkateswar et al. | 347/240 |
| 5,461,411 A | 10/1995 | Florence et al. | 347/240 |
| 5,461,547 A | 10/1995 | Ciupke et al. | 362/31 |
| 5,463,347 A | 10/1995 | Jones et al. | 330/253 |
| 5,463,497 A | 10/1995 | Muraki et al. | 359/618 |
| 5,465,175 A | 11/1995 | Woodgate et al. | 359/463 |
| 5,467,106 A | 11/1995 | Salomon | 345/87 |
| 5,467,138 A | 11/1995 | Gove | 348/452 |
| 5,467,146 A | 11/1995 | Huang et al. | 348/743 |
| 5,469,302 A | 11/1995 | Lim | 359/846 |
| 5,471,341 A | 11/1995 | Warde et al. | 359/293 |
| 5,473,512 A | 12/1995 | Degani et al. | 361/760 |
| 5,475,236 A | 12/1995 | Yoshizaki | 257/48 |
| 5,480,839 A | 1/1996 | Ezawa et al. | 437/209 |
| 5,481,118 A | 1/1996 | Tew | 250/551 |
| 5,481,133 A | 1/1996 | Hsu | 257/621 |
| 5,482,564 A | 1/1996 | Douglas et al. | 134/18 |
| 5,482,818 A | 1/1996 | Nelson | 430/394 |
| 5,483,307 A | 1/1996 | Anderson | 353/98 |
| 5,485,172 A | 1/1996 | Sawachika et al. | 345/8 |
| 5,485,304 A | 1/1996 | Kaeriyama | 359/291 |
| 5,485,354 A | 1/1996 | Ciupke et al. | 362/31 |
| 5,486,698 A | 1/1996 | Hanson et al. | 250/332 |
| 5,486,841 A | 1/1996 | Hara et al. | 345/8 |
| 5,486,946 A | 1/1996 | Jachimowicz et al. | 359/263 |
| 5,488,431 A | 1/1996 | Gove et al. | 348/716 |
| 5,489,952 A | 2/1996 | Gove et al. | 348/771 |
| 5,490,009 A | 2/1996 | Venkateswar et al. | 359/291 |
| 5,491,510 A | 2/1996 | Gove | 348/77 |
| 5,491,612 A | 2/1996 | Nicewarner, Jr. | 361/760 |
| 5,491,715 A | 2/1996 | Flaxl | 375/344 |
| 5,493,177 A | 2/1996 | Muller et al. | 313/578 |
| 5,493,439 A | 2/1996 | Engle | 359/292 |
| 5,497,172 A | 3/1996 | Doherty et al. | 345/85 |
| 5,497,197 A | 3/1996 | Gove et al. | 348/388 |
| 5,497,262 A | 3/1996 | Kaeriyama | 359/223 |
| 5,499,060 A | 3/1996 | Gove et al. | 348/651 |
| 5,499,062 A | 3/1996 | Urbanus | 348/771 |
| 5,500,761 A | 3/1996 | Goossen et al. | 359/290 |
| 5,502,481 A | 3/1996 | Dentinger et al. | 348/51 |
| 5,504,504 A | 4/1996 | Markandey et al. | 345/214 |
| 5,504,514 A | 4/1996 | Nelson | 347/130 |
| 5,504,575 A | 4/1996 | Stafford | 356/330 |
| 5,504,614 A | 4/1996 | Webb et al. | 359/223 |
| 5,506,171 A | 4/1996 | Leonard et al. | 437/187 |
| 5,506,597 A | 4/1996 | Thompson et al. | 345/85 |
| 5,506,720 A | 4/1996 | Yoon | 359/224 |
| 5,508,558 A | 4/1996 | Robinette, Jr. et al. | 257/700 |
| 5,508,561 A | 4/1996 | Tago et al. | 257/737 |
| 5,508,565 A | 4/1996 | Hatakeyama et al. | 257/777 |
| 5,508,750 A | 4/1996 | Hewlett et al. | 348/558 |
| 5,508,840 A | 4/1996 | Vogel et al. | 359/291 |
| 5,508,841 A | 4/1996 | Lin et al. | 359/318 |
| 5,510,758 A | 4/1996 | Fujita et al. | 333/247 |
| 5,510,824 A | 4/1996 | Nelson | 347/239 |
| 5,512,374 A | 4/1996 | Wallace et al. | 428/422 |
| 5,512,748 A | 4/1996 | Hanson | 250/332 |
| 5,515,076 A | 5/1996 | Thompson et al. | 345/139 |
| 5,516,125 A | 5/1996 | McKenna | 279/3 |
| 5,517,340 A | 5/1996 | Doany et al. | 359/41 |
| 5,517,347 A | 5/1996 | Sampsell | 359/224 |
| 5,517,357 A | 5/1996 | Shibayama | 359/547 |
| 5,517,359 A | 5/1996 | Gelbart | 359/623 |
| 5,519,251 A | 5/1996 | Sato et al. | 257/666 |
| 5,519,450 A | 5/1996 | Urbanus et al. | 348/600 |
| 5,521,748 A | 5/1996 | Sarraf | 359/321 |
| 5,523,619 A | 6/1996 | McAllister et al. | 257/686 |
| 5,523,628 A | 6/1996 | Williams et al. | 257/777 |
| 5,523,803 A | 6/1996 | Urbanus et al. | 348/771 |
| 5,523,878 A | 6/1996 | Wallace et al. | 359/290 |
| 5,523,881 A | 6/1996 | Florence et al. | 359/561 |
| 5,523,920 A | 6/1996 | Machuga et al. | 361/767 |
| 5,524,155 A | 6/1996 | Weaver | 385/24 |
| 5,534,107 A | 7/1996 | Gray et al. | 156/643.1 |
| 5,534,883 A | 7/1996 | Koh | 345/3 |
| 5,539,422 A | 7/1996 | Heacock et al. | 345/8 |
| 5,544,306 A | 8/1996 | Deering et al. | 395/164 |
| 5,552,635 A | 9/1996 | Kim et al. | |
| 5,554,304 A | 9/1996 | Suzuki | 216/2 |
| 5,576,878 A | 11/1996 | Henck | 359/224 |

| | | | |
|---|---|---|---|
| 5,602,671 A | 2/1997 | Hornbeck ................... 359/224 |
| 5,606,181 A | 2/1997 | Sakuma et al. ............... 257/88 |
| 5,606,447 A | 2/1997 | Asada et al. ................ 359/199 |
| 5,610,438 A | 3/1997 | Wallace et al. ............. 257/682 |
| 5,623,361 A | 4/1997 | Engle .......................... 359/291 |
| 5,629,566 A | 5/1997 | Doi et al. .................... 257/789 |
| 5,629,801 A | 5/1997 | Staker et al. ................ 359/572 |
| 5,640,216 A | 6/1997 | Hasegawa et al. ............ 349/58 |
| 5,658,698 A | 8/1997 | Yagi et al. ................... 4330/11 |
| 5,661,592 A | 8/1997 | Bornstein et al. ........... 359/291 |
| 5,661,593 A | 8/1997 | Engle ......................... 359/292 |
| 5,663,817 A | 9/1997 | Frapin et al. .................. 349/5 |
| 5,668,611 A | 9/1997 | Ernstoff et al. ............. 348/771 |
| 5,673,139 A | 9/1997 | Johnson ...................... 359/291 |
| 5,677,783 A | 10/1997 | Bloom et al. ............... 359/224 |
| 5,689,361 A | 11/1997 | Damen et al. ............... 359/284 |
| 5,691,836 A | 11/1997 | Clark .......................... 359/247 |
| 5,694,740 A | 12/1997 | Martin et al. ................. 53/431 |
| 5,696,560 A | 12/1997 | Songer ....................... 348/436 |
| 5,699,740 A | 12/1997 | Gelbart ....................... 101/477 |
| 5,704,700 A | 1/1998 | Kappel et al. ................ 353/31 |
| 5,707,160 A | 1/1998 | Bowen ....................... 400/472 |
| 5,712,649 A | 1/1998 | Tosaki .......................... 345/8 |
| 5,713,652 A | 2/1998 | Zavracky et al. ............ 353/122 |
| 5,726,480 A | 3/1998 | Pister ......................... 257/415 |
| 5,731,802 A | 3/1998 | Aras et al. .................. 345/148 |
| 5,734,224 A * | 3/1998 | Tagawa et al. ............. 313/292 |
| 5,742,373 A | 4/1998 | Alvelda ...................... 349/204 |
| 5,744,752 A | 4/1998 | McHerron et al. ......... 174/52.4 |
| 5,745,271 A | 4/1998 | Ford et al. .................. 359/130 |
| 5,757,354 A | 5/1998 | Kawamura .................. 345/126 |
| 5,757,536 A | 5/1998 | Ricco et al. ................ 359/224 |
| 5,764,280 A | 6/1998 | Bloom et al. ................ 348/53 |
| 5,768,009 A | 6/1998 | Little .......................... 359/293 |
| 5,770,473 A | 6/1998 | Hall et al. .................... 438/26 |
| 5,793,519 A | 8/1998 | Furlani et al. ............... 359/291 |
| 5,798,743 A | 8/1998 | Bloom ......................... 345/90 |
| 5,798,805 A | 8/1998 | Ooi et al. ..................... 349/10 |
| 5,801,074 A * | 9/1998 | Kim et al. ................... 438/118 |
| 5,802,222 A | 9/1998 | Rasch et al. ................. 385/1 |
| 5,808,323 A | 9/1998 | Spaeth et al. ................ 257/88 |
| 5,808,797 A | 9/1998 | Bloom et al. ............... 359/572 |
| 5,815,126 A | 9/1998 | Fan et al. ...................... 345/8 |
| 5,825,443 A | 10/1998 | Kawasaki et al. ............ 349/95 |
| 5,832,148 A | 11/1998 | Yariv |
| 5,835,255 A | 11/1998 | Miles ......................... 359/291 |
| 5,835,256 A | 11/1998 | Huibers ...................... 359/291 |
| 5,837,562 A | 11/1998 | Cho ............................ 438/51 |
| 5,841,579 A | 11/1998 | Bloom et al. ............... 359/572 |
| 5,841,929 A | 11/1998 | Komatsu et al. |
| 5,844,711 A | 12/1998 | Long, Jr. .................... 359/291 |
| 5,847,859 A | 12/1998 | Murata ....................... 359/201 |
| 5,862,164 A | 1/1999 | Hill .............................. 372/27 |
| 5,868,854 A | 2/1999 | Kojima et al. ............... 134/1.3 |
| 5,886,675 A | 3/1999 | Aye et al. ...................... 345/7 |
| 5,892,505 A | 4/1999 | Tropper ...................... 345/208 |
| 5,895,233 A | 4/1999 | Higashi et al. ............. 438/107 |
| 5,898,515 A | 4/1999 | Furlani et al. ............... 359/290 |
| 5,903,243 A | 5/1999 | Jones ............................ 345/7 |
| 5,903,395 A | 5/1999 | Rallison et al. .............. 359/630 |
| 5,910,856 A | 6/1999 | Ghosh et al. ............... 359/291 |
| 5,912,094 A | 6/1999 | Aksyuk et al. ................ 430/5 |
| 5,912,608 A | 6/1999 | Asada ........................ 335/222 |
| 5,914,801 A | 6/1999 | Dhuler et al. ............... 359/230 |
| 5,915,168 A | 6/1999 | Salatino et al. ............. 438/110 |
| 5,919,548 A | 7/1999 | Barron et al. ............... 428/138 |
| 5,920,411 A | 7/1999 | Duck et al. .................. 359/127 |
| 5,920,418 A | 7/1999 | Shiono et al. ............... 359/246 |
| 5,923,475 A | 7/1999 | Kurtz et al. ................. 359/619 |
| 5,926,309 A | 7/1999 | Little ........................... 359/293 |
| 5,926,318 A | 7/1999 | Hebert ........................ 359/618 |
| 5,942,791 A | 8/1999 | Shorrocks et al. .......... 257/522 |
| 5,949,390 A | 9/1999 | Nomura et al. ............... 345/32 |
| 5,949,570 A | 9/1999 | Shiono et al. ............... 359/291 |
| 5,953,161 A | 9/1999 | Troxell et al. ............... 359/618 |
| 5,955,771 A | 9/1999 | Kurtz et al. ................. 257/419 |
| 5,963,788 A | 10/1999 | Barron et al. ................. 438/48 |
| 5,978,127 A | 11/1999 | Berg ........................... 359/279 |
| 5,982,553 A | 11/1999 | Bloom et al. ............... 359/627 |
| 5,986,634 A | 11/1999 | Alioshin et al. ............. 345/126 |
| 5,986,796 A | 11/1999 | Miles ......................... 359/260 |
| 5,995,303 A | 11/1999 | Honguh et al. .............. 359/708 |
| 5,999,319 A | 12/1999 | Castracane .................. 359/573 |
| 6,004,912 A | 12/1999 | Gudeman .................... 508/577 |
| 6,012,336 A | 1/2000 | Eaton et al. |
| 6,016,222 A | 1/2000 | Setani et al. ................. 359/571 |
| 6,025,859 A | 2/2000 | Ide et al. ..................... 347/135 |
| 6,038,057 A | 3/2000 | Brazas, Jr. et al. .......... 359/291 |
| 6,040,748 A | 3/2000 | Gueissaz ....................... 335/78 |
| 6,046,840 A | 4/2000 | Huibers ...................... 359/291 |
| 6,055,090 A | 4/2000 | Miles .......................... 359/291 |
| 6,057,520 A | 5/2000 | Goodwin-Johansson .... 200/181 |
| 6,061,166 A | 5/2000 | Furlani et al. ............... 359/254 |
| 6,061,489 A | 5/2000 | Ezra ........................... 385/115 |
| 6,062,461 A * | 5/2000 | Sparks et al. .............. 228/123.1 |
| 6,064,404 A | 5/2000 | Aras et al. .................. 345/507 |
| 6,069,392 A | 5/2000 | Tai et al. ..................... 257/419 |
| 6,071,652 A | 6/2000 | Feldman et al. ............... 430/5 |
| 6,075,632 A | 6/2000 | Braun ......................... 359/124 |
| 6,084,626 A | 7/2000 | Ramanujan et al. ........ 347/239 |
| 6,088,102 A | 7/2000 | Manhart ...................... 356/354 |
| 6,090,717 A | 7/2000 | Powell et al. ............... 438/710 |
| 6,091,521 A | 7/2000 | Popovich ...................... 359/15 |
| 6,096,576 A | 8/2000 | Corbin et al. ............... 438/108 |
| 6,096,656 A | 8/2000 | Matzke et al. |
| 6,097,352 A | 8/2000 | Zavracky et al. .............. 345/7 |
| 6,101,036 A | 8/2000 | Bloom ......................... 359/567 |
| 6,115,168 A | 9/2000 | Zhao et al. .................. 359/247 |
| 6,122,299 A | 9/2000 | DeMars et al. ............... 372/20 |
| 6,123,985 A | 9/2000 | Robinson et al. ........... 427/162 |
| 6,124,145 A | 9/2000 | Stemme et al. ............... 438/26 |
| 6,130,770 A | 10/2000 | Bloom ......................... 359/224 |
| 6,144,481 A | 11/2000 | Kowarz et al. .............. 359/291 |
| 6,147,789 A | 11/2000 | Gelbart ........................ 359/231 |
| 6,154,259 A | 11/2000 | Hargis et al. ................ 348/756 |
| 6,154,305 A | 11/2000 | Dickensheets et al. |
| 6,163,026 A | 12/2000 | Bawolek et al. ............. 250/351 |
| 6,163,402 A | 12/2000 | Chou et al. .................. 359/443 |
| 6,169,624 B1 | 1/2001 | Godil et al. ................. 359/237 |
| 6,172,796 B1 | 1/2001 | Kowarz et al. .............. 359/290 |
| 6,172,797 B1 | 1/2001 | Huibers ...................... 359/291 |
| 6,177,980 B1 | 1/2001 | Johnson ........................ 355/67 |
| 6,181,458 B1 | 1/2001 | Brazas, Jr. et al. .......... 359/290 |
| 6,188,519 B1 | 2/2001 | Johnson ...................... 359/572 |
| 6,195,196 B1 | 2/2001 | Kimura et al. .............. 359/295 |
| 6,197,610 B1 | 3/2001 | Toda ............................ 438/50 |
| 6,210,988 B1 | 4/2001 | Howe et al. ................... 438/50 |
| 6,215,579 B1 | 4/2001 | Bloom et al. ............... 359/298 |
| 6,219,015 B1 | 4/2001 | Bloom et al. ................. 345/87 |
| 6,222,954 B1 | 4/2001 | Riza ............................. 385/18 |
| 6,229,650 B1 | 5/2001 | Reznichenko et al. ...... 359/566 |
| 6,229,683 B1 | 5/2001 | Goodwin-Johansson .... 361/233 |
| 6,241,143 B1 | 6/2001 | Kuroda .................... 228/110.1 |
| 6,249,381 B1 | 6/2001 | Suganuma |
| 6,251,842 B1 | 6/2001 | Gudeman .................... 508/577 |
| 6,252,697 B1 | 6/2001 | Hawkins et al. ............ 359/290 |
| 6,254,792 B1 | 7/2001 | Van Buskirk et al. ........ 216/13 |
| 6,261,494 B1 | 7/2001 | Zavracky et al. ............ 264/104 |
| 6,268,952 B1 | 7/2001 | Godil et al. ................. 359/291 |
| 6,271,145 B1 | 8/2001 | Toda ........................... 438/706 |
| 6,271,808 B1 | 8/2001 | Corbin .......................... 345/7 |
| 6,274,469 B1 | 8/2001 | Yu .............................. 438/592 |

| | | |
|---|---|---|
| 6,282,213 B1 | 8/2001 | Gutin et al. |
| 6,290,859 B1 | 9/2001 | Fleming et al. ............... 216/2 |
| 6,290,864 B1 | 9/2001 | Patel et al. .................... 216/79 |
| 6,300,148 B1 | 10/2001 | Birdsley et al. .............. 438/15 |
| 6,303,986 B1 | 10/2001 | Shook ......................... 257/680 |
| 6,310,018 B1 | 10/2001 | Behr et al. ................... 510/175 |
| 6,313,901 B1 | 11/2001 | Cacharelis |
| 6,323,984 B1 | 11/2001 | Trisnadi ..................... 359/245 |
| 6,327,071 B1 | 12/2001 | Kimura ....................... 359/291 |
| 6,342,960 B1 | 1/2002 | McCullough ............... 359/124 |
| 6,346,430 B1 | 2/2002 | Raj et al. |
| 6,356,577 B1 | 3/2002 | Miller ......................... 372/107 |
| 6,356,689 B1 | 3/2002 | Greywall ....................... 385/52 |
| 6,359,333 B1 * | 3/2002 | Wood et al. ............... 174/52.3 |
| 6,384,959 B1 | 5/2002 | Furlani et al. .............. 359/291 |
| 6,387,723 B1 | 5/2002 | Payne et al. ................... 438/48 |
| 6,392,309 B1 * | 5/2002 | Wataya et al. .............. 257/675 |
| 6,396,789 B1 | 5/2002 | Guerra et al. ............... 369/112 |
| 6,418,152 B1 | 7/2002 | Davis |
| 6,421,179 B1 | 7/2002 | Gutin et al. ................. 359/572 |
| 6,438,954 B1 | 8/2002 | Goetz et al. |
| 6,445,502 B1 | 9/2002 | Islam et al. ................. 359/571 |
| 6,452,260 B1 | 9/2002 | Corbin et al. ............... 257/686 |
| 6,466,354 B1 | 10/2002 | Gudeman ................... 359/247 |
| 6,479,811 B1 | 11/2002 | Kruschwitz et al. |
| 6,480,634 B1 | 11/2002 | Corrigan ........................ 385/4 |
| 6,497,490 B1 | 12/2002 | Miller et al. ................ 359/614 |
| 6,525,863 B1 | 2/2003 | Riza .......................... 359/290 |
| 6,563,974 B2 | 5/2003 | A. Riza ....................... 385/18 |
| 6,565,222 B1 | 5/2003 | Ishii et al. .................. 359/883 |
| 6,569,717 B1 | 5/2003 | Murade |
| 2001/0019454 A1 | 9/2001 | Tadic-Galeb et al. ....... 359/649 |
| 2002/0015230 A1 | 2/2002 | Pilossof et al. ............. 359/558 |
| 2002/0021485 A1 | 2/2002 | Pilossof ..................... 359/295 |
| 2002/0079432 A1 | 6/2002 | Lee et al. ................... 250/216 |
| 2002/0105725 A1 | 8/2002 | Sweatt et al. ............... 359/566 |
| 2002/0112746 A1 | 8/2002 | DeYoung et al. ............. 134/36 |
| 2002/0131228 A1 | 9/2002 | Potter |
| 2002/0131230 A1 | 9/2002 | Potter ......................... 361/277 |
| 2002/0135708 A1 | 9/2002 | Murden et al. |
| 2002/0176151 A1 | 11/2002 | Moon et al. |
| 2002/0195418 A1 | 12/2002 | Kowarz et al. |
| 2002/0196492 A1 | 12/2002 | Trisnadi et al. |
| 2003/0056078 A1 | 3/2003 | Johansson et al. |

* cited by examiner

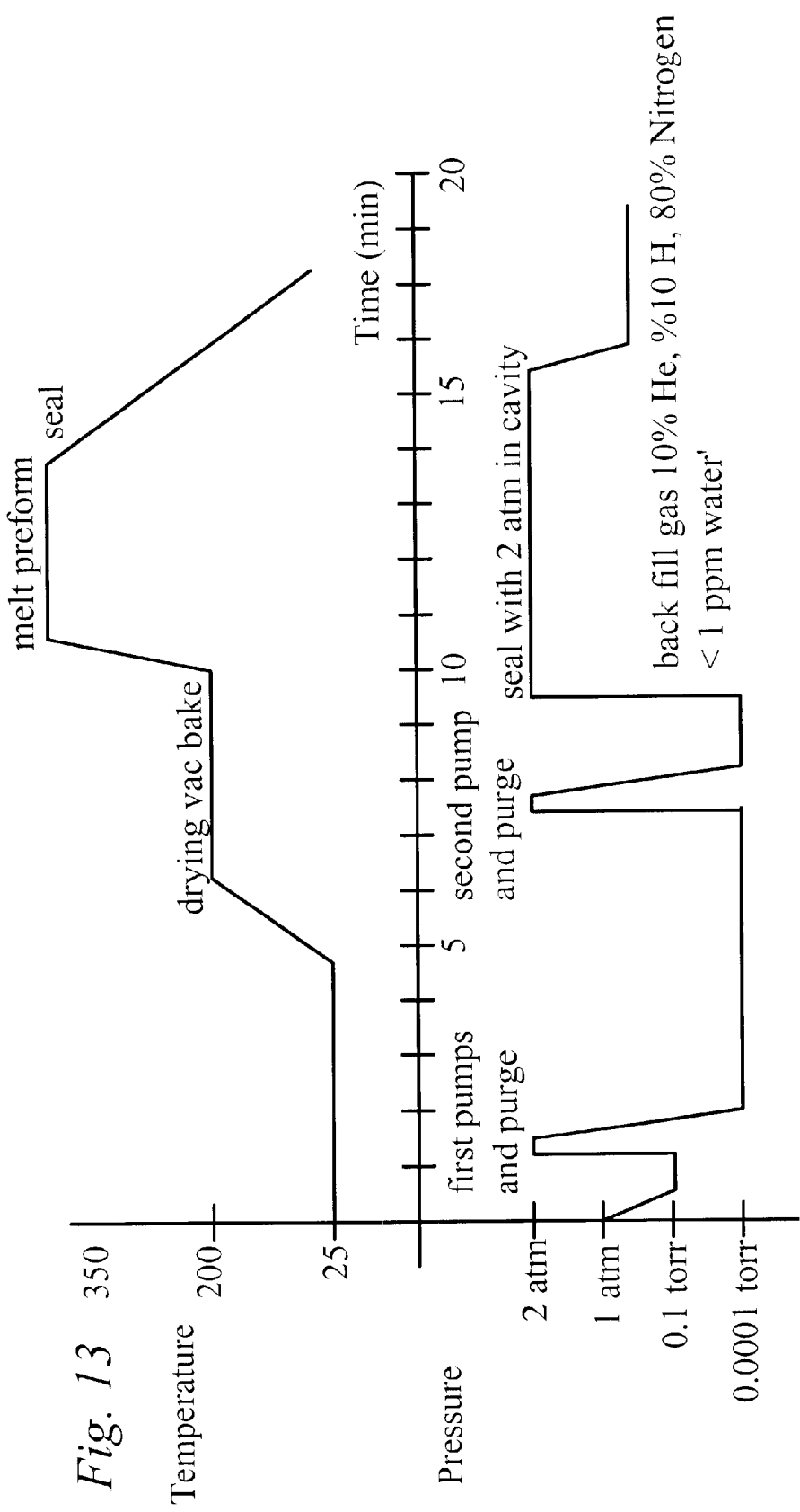

METHOD OF AND APPARATUS FOR SEALING AN HERMETIC LID TO A SEMICONDUCTOR DIE

This Patent Application is a Divisional Patent Application of the U.S. patent application Ser. No. 09/124,710, filed Jul. 29, 1998, now U.S. Pat. No. 6,303,986. The U.S. patent application Ser. No. 09/124,710, filed Jul. 29, 1998 now U.S. Pat. No. 6,303,986 is hereby incorporated by reference.

FIELD OF THE INVENTION

This invention relates to the field of passivating semiconductor die, especially hermetically. More particularly, this invention relates to mounting and sealing an optically transparent lid onto an optically active semiconductor integrated circuit.

BACKGROUND OF THE INVENTION

In the manufacture of integrated circuits (chips) it is well known that it is desirable to encapsulate the chip protected from mechanical damage and contamination. These techniques are known to passivate the chips. There are a variety of well known techniques available for encapsulating the chip. These techniques include mounting the chip within a cavity in a package, wire bonding the chip to a lead frame and then enclosing the package with a lid. Another well known technique includes mounting the chip to a lead frame, wire bonding the chip to the lead frame and then passivating the chip and a portion of the lead frame in a molded plastic or plastic epoxy body. A third common technique for passivating a chip includes flip-chip bonding the chip to a printed circuit board and then covering the chip with a plastic resin.

An EPROM is a read-only memory device. The program or data which is stored in an EPROM can only be erased by causing or allowing optical radiation (ultraviolet and visible) to impinge on the surface of the EPROM. Accordingly, conventional chip packaging techniques are inadequate because they are opaque to optical radiation. To solve this problem, makers of ultraviolet and visible EPROMs mount the EPROM chip within the cavity of a ceramic package and hermeticallly seal the assembly with an optically transparent lid.

Micro-electro-mechanical devices (MEMs) are another well known class of silicon semiconductors devices. MEMs are useful for a variety of applications including strain gauges, accelerometers, electronic levels, and also for displays or other optical devices. Because of their extremely small moving parts, MEMs are particularly susceptible to ambient conditions. Accordingly, MEMs are traditionally sealed within the cavity of an hermetic package which is then hermetically sealed to control the environment to which the MEM is subjected.

When the MEM is to be used in a display application, it is required that optical energy (light) be able to penetrate the package, impinge on the surface of the MEM for modulation, and then escape from the package for forming a display image. The ability of light to enter and leave the package is also required for other optical devices as well. Though conventional ceramic packages are hermetic, because they are opaque they are unsuitable for use with a display or optical MEM. In certain display or optical MEM applications, the MEM is mounted within the cavity of a ceramic package. The assembly is made hermetic by affixing a transparent lid to the ceramic package with an hermetic seal in much the same way as an EPROM package.

It is well known that much of the cost associated with manufacturing silicon semiconductor devices is incurred through the packaging technology. This is particularly true with hermetic ceramic packages. The cost of packages including an optically transparent window is considerably more expensive still.

Under certain circumstances when building a display or other optical MEM assembly it is important that the MEM and transparent lid have a precise physical relationship to one another. For some applications, it is important that the MEM and transparent lid be precisely parallel to one another. For other applications, it is important that the MEM and transparent lid are a precise angle between the structures. Conventional silicon semiconductor chip packaging technology does not take into account an ability to control an angle between the chip and the package lid.

What is needed is a method of and an apparatus for hermetically sealing MEMs intended for use in a display application. What is needed is a method of and an apparatus for hermetically sealing MEMs intended for use in an optical application. What is further needed is a method of and an apparatus for sealing MEMs having a high pin count. Also what is needed is a method of and an apparatus for protecting MEMs which is relatively inexpensive. There is a need for a method of and an apparatus for hermetically sealing the display MEM which can be mounted to the MEM through an uncomplicated manufacturing process. What is further needed is a method and apparatus for sealing display MEMs where an angle of the lid relative to the MEM can be precisely controlled through the assembly process.

SUMMARY OF THE INVENTION

A method and apparatus of hermetically passivating a semiconductor device includes sealing a lid directly onto a semiconductor substrate. An active device is formed on the surface of the substrate and is surrounded by a substantially planar lid sealing region, which in turn is surrounded by bonding pads. A first layer of solderable material is formed on the lid sealing region. A lid is provided which has a second layer of solderable material in a configuration corresponding to the first layer. A solder layer is provided between the first layer and second layer of solderable materials. In the preferred embodiment, the solder is formed over the second layer. Heat is provided to hermetically join the lid to the semiconductor device without requiring a conventional package. Preferably the first and second layers are sandwiches of conventionally known solderable materials which can be processed using conventional semiconductor techniques. An angle between the lid and the semiconductor device can be controlled by adjusting relative widths of one or both the layers of solderable materials.

Alternatively, the lid can be sealed to the substrate using other techniques. In a first alternative, an epoxy can be used. An optional first spacing material is formed in the lid sealing region. An epoxy is formed in a configuration corresponding to the lid sealing region. The lid and the semiconductor device are aligned and heated to hermetically join them together.

In a second alternative, a glass frit can be used. An optional second spacing material is formed in the lid sealing region. A glass frit is formed in a configuration corresponding to the lid sealing region. The lid and the semiconductor device are aligned and heated to hermetically join them together.

BRIEF DESCRIPTION OF THE DRAWINGS

FIG. 13 shows a graph representing temperature versus time for a process of sealing a lid to a semiconductor device according to the present invention.

FIG. 14 shows a graph representing pressure versus time for the process of sealing a lid to a semiconductor device according to the present invention.

DETAILED DESCRIPTION OF THE PREFERRED EMBODIMENT

The present invention was developed to hermetically seal the mechanically active portion of a MEM for a display device. In particular, the MEM is a diffraction grating light valve™ light modulator. Examples of the grating light valve™ light modulator are found U.S. Pat. Nos. 5,311,360 and 5,841,579. The developers of this technology have learned that if ambient moisture becomes deposited upon the ribbon structures that surface charging occurs which prevents suitable operation of the grating light valve™ light modulator. To avoid this sort of problem, it is preferable that the mechanically active portion of the MEM structure is passivated in an hermetic package. In addition, it is important to seal the form of glass or other transparent material having suitable optical characteristics.

In contrast to other hermetically passivating technologies for a silicon semiconductor device, the hermetic lid of the present invention is sealed directly onto the surface of the silicon semiconductor device. It will be readily apparent to those of ordinary skill in the art that the passivating technology of the present invention can also be used for hermetically sealing other types of devices including non-silicon or non-semiconductor devices or for use with non-transparent lid structures.

Figure 1:
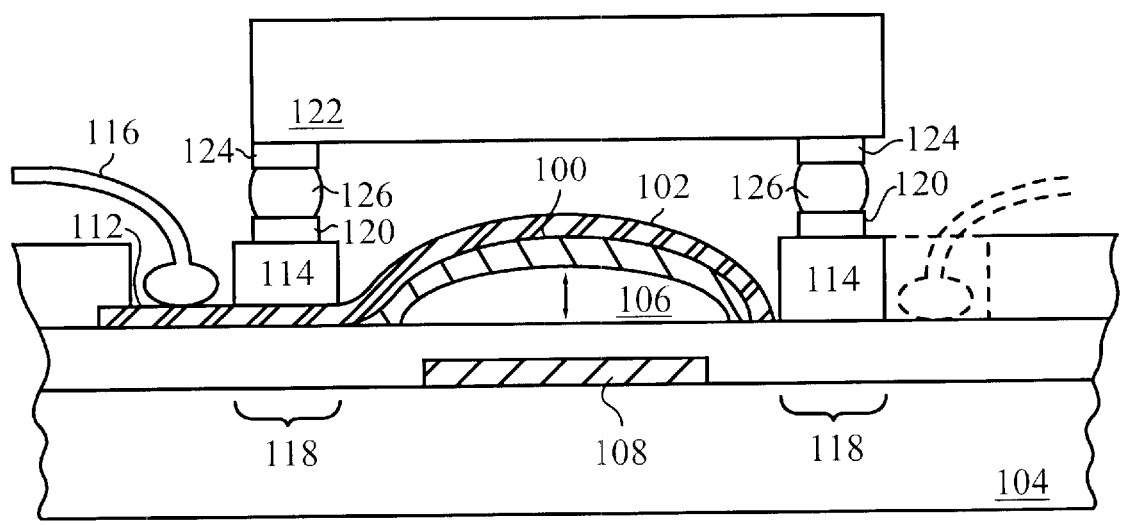
FIG. 1 shows a simplified cross section view of the preferred embodiment.

FIG. 1 shows a representative cross section view of the silicon semiconductor device to which the transparent lid is hermetically sealed. The silicon semiconductor device of preferred embodiment is a grating light valve™ light modulator for forming a display. The cross-section drawing FIG. 1 is not drawn to scale nor does it include all the elements necessarily found in an operational grating light valve™ light modulator. These omissions are not intended to be limiting but rather are made in this document to avoid obscuring the invention in unnecessary and extraneous details.

A conductive ribbon 100 including a metallic conductive and reflective covering 102 is formed over the semiconductor substrate 104 with an air gap 106 between the ribbon 100 and the substrate 104. A conductive electrode 108 is formed on the surface of the substrate 104 and is covered by an insulating layer 110. The conductive electrode 108 is positioned underneath the ribbon 100 and an air gap 106 is formed therebetween. The reflective covering 102 extends beyond the region of the mechanically active ribbon 100 and is configured as a conventional bond pad 112 at its distal end. The device is passivated with a conventional overlying insulating passivation layer 114. The passivation layer 114 does not cover the bond pads 112 nor the ribbon structures 100/102. Control and power signals are coupled to the semiconductor device using conventional wire bonding structures 116.

According to conventional semiconductor manufacturing techniques, devices are packed as densely onto the surface of the semiconductor substrate as possible. Here however, because the optical glass is hermetically sealed directly onto the semiconductor device, the bond pads 112 are removed a considerable distance from the ribbon structures 100/102 to provide a lid sealing region 118. Solderable material 120 is formed onto the lid sealing regions 118 using conventional semiconductor processing techniques.

Because the preferred application for the present invention is for hermetically sealing a grating light valve™ light modulator for use in a display application, the lid 122 is preferably formed of optical quality material. It will be understood by persons of ordinary skill in the art that the lid 122 can be coated with an optically sensitive material for any of a variety of purposes including but not limited to filtering unwanted radiation, enhancing reflectivity, or decreasing reflectivity. Additionally, the lid 122 can also be configured to have optical characteristics. In other words, the lid 122 can be a lens of any convenient type.

Once the lid 122 is formed to a size appropriate to fit concurrently over the lid sealing regions 118 a solderable material 124 is formed in a ring surrounding the periphery of one face of the lid 122 using conventional semiconductor processing techniques. Next, a solder 126 is deposited onto the solderable material 124 so that the lid 122 can be joined to the semiconductor device. Though not shown to scale, it is clear from the drawing of FIG. 1 that a significant space exists between the lid 122 and the ribbon structures 100/102 to avoid interfering with one another. In this way, the ribbon structures 100/102 are free to move upwardly and downwardly.

Figure 2:
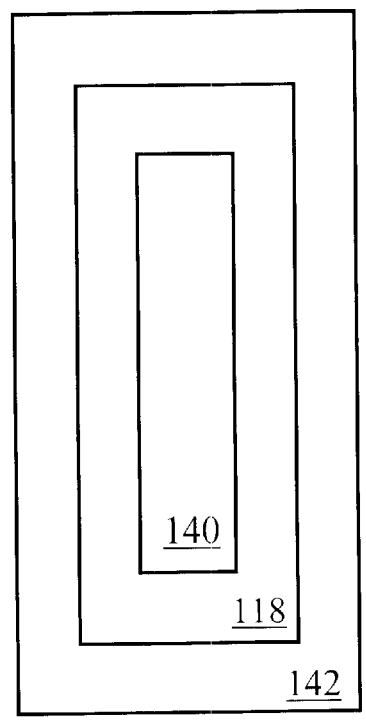
FIG. 2 shows a block diagram exemplary plan view of a semiconductor device according to the present invention.

FIG. 2 shows a plan view of an exemplary device according to the present invention wherein the various regions are shown as blocks. It will be apparent to persons of ordinary skill in the art that the precise dimensions and ratios between the various structures can be modified significantly and still fall within the spirit and scope of these teachings. According to the preferred embodiment of the present invention the lid 122 is an optical element intended for mounting over a light valve™ light modulator to be used as a display engine. The ribbon structures of the grating light valve™ light modulator comprise a mechanically active region 140. Surrounding the mechanically active region 140 is the lid sealing region 118. Where appropriate, identical reference numerals will be used in the several drawings to identify the same elements. As previously described, the lid sealing region 118 is passivated and includes no mechanically active elements such as traditionally found in a MEM device. Similarly, the lid sealing region 118 also includes no bond pads where other off chip interface structures such as the lid 122 would interfere with the effective operation of such. It is possible that the lid sealing region 118 could include active electronic elements. However, in the event that the lid sealing region 118 did include active electronic elements effort must be taken to planarize that region in order to provide the surface to which the lid 122 can properly mate.

The bonding region 142 surrounds the lid sealing region 118. The bonding region 142 includes the several bond pads 112 necessary for making interconnection from the semiconductor device to off-chip circuits and systems. In the case of the display element such as the grating light valve™ light modulator of the present invention more than one thousand bond pads 112 are required. Other types of semiconductor devices will require more or fewer bond pads depending upon their intended application.

Figure 3:
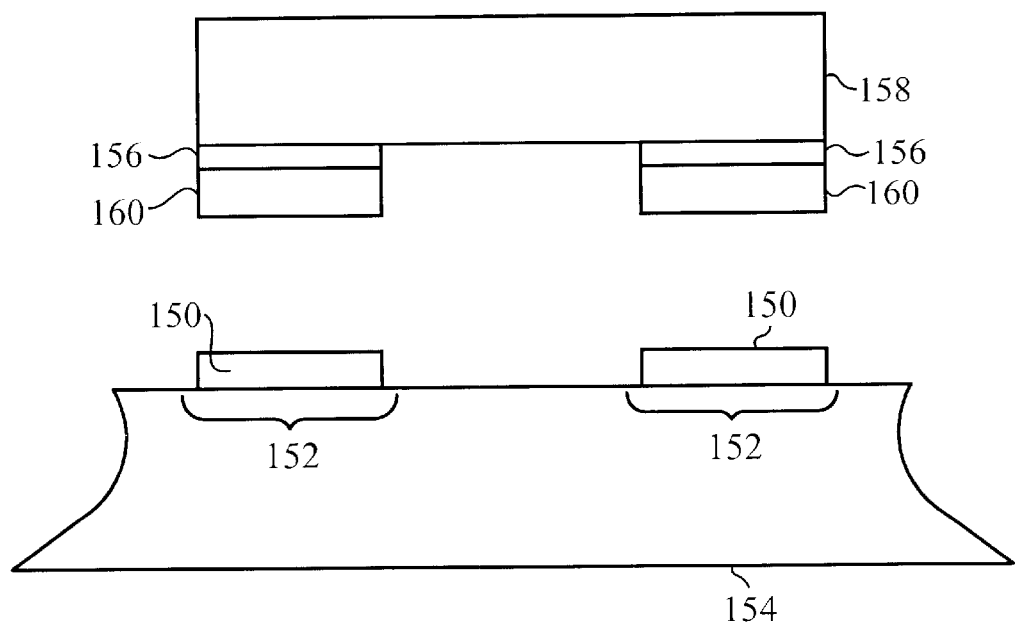
FIG. 3 shows a simplified schematic cross section diagram of the lid and the semiconductor device prior to sealing the lid.

FIG. 3 shows a schematic cross-sectional representation of a first embodiment of present invention. As previously discussed a solderable material 150 is formed onto the lid sealing region 152 of the semiconductor device 154. A solderable material 156 is also formed around the peripheral edges of the transparent lid 158. A layer of solder 160 is formed over the layer of solderable material 156. It will be apparent to one of ordinary skill in the art that the solder could also be applied to the first layer of solderable material. However, the inventors prefer applying the solder to the lid to avoid contaminating the wafer with solder.

Figure 4:
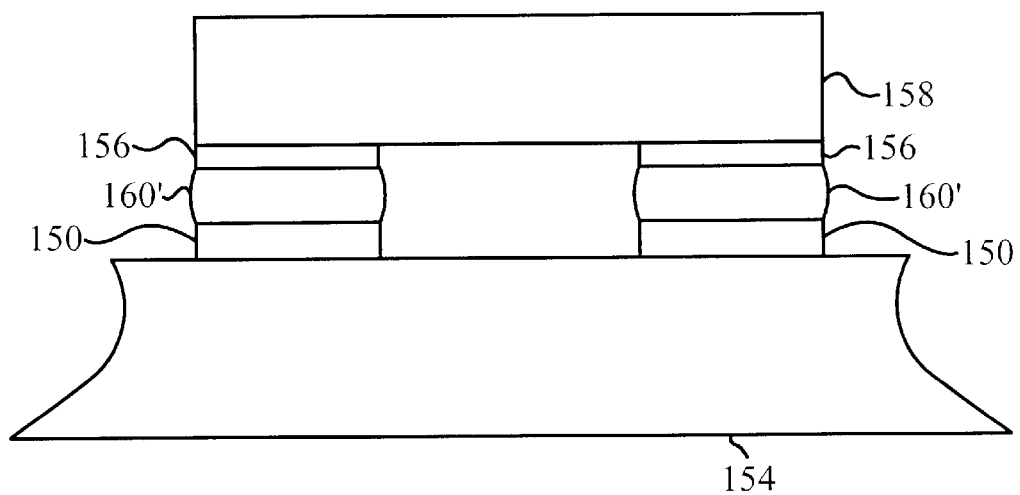
FIG. 4 shows a simplified schematic cross section diagram of the lid sealed to the semiconductor device according to the present invention with somewhat more detail than FIG. 3.

The transparent lid 158 is brought into contact with and aligned to the semiconductor device 154. Heat is applied to the assembly allowing the solder 160 to flow. Surface tension of the solder 160' after it has become a liquid causes it to remain between the solderable material 150 on the semiconductor device 154 and the solderable material 156 on the transparent lid 158. The solder 160' is identified with a prime (') on the reference numeral to signify that the structure has changed because of flowing and resolidifying. The assembly is heated for a sufficient time to allow the solder 160 to flow and wet all solderable surfaces. Once the heat is removed the solder 160' re-solidifies and the transparent lid 158 is hermetically sealed to the semiconductor device 154 as shown in the cross section view of FIG. 4.

Figure 5:
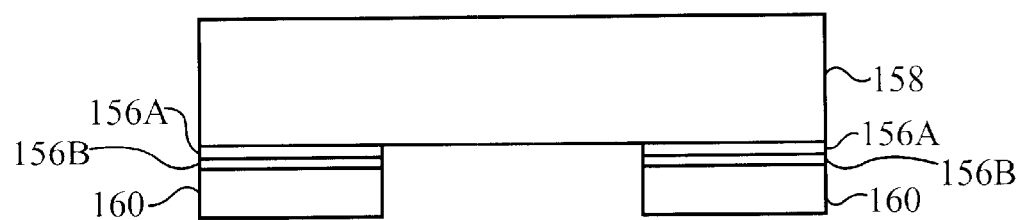
FIG. 5 shows a schematic cross section diagram of the lid according to the present invention with somewhat more detail than FIG. 3.

FIG. 5 shows a cross section view of the lid and the metallization layers. According to the preferred embodiment, the solderable material 156 actually comprises a sandwich of layers. In the preferred embodiment, the solderable layer 156 includes a first layer 156A formed against the transparent lid 158. A second layer 156B is formed over the first layer 156A and the layer of solder 160 is then formed over the second layer 156B. In the preferred embodiment using these layers, the first layer 156A is a layer of chrome of about 300 angstroms and the second layer 156B is a layer of gold of about 10,000 angstroms. The layer of solder 160 is preferably 80 Au/20 Sn solder about 50 microns thick.

According to the preferred embodiment, the transparent lid 158 is segmented prior to forming the metallization layers thereon. The inventors have learned through experimentation that the cost of masking the side edges of the transparent lid 158 exceeds the cost of the materials. Thus, in actual practice gold and chrome are also formed on the side edges of the transparent lid 158. While this is not preferred, it causes no deleterious effects. As manufacturing processes develop, the golden chrome on the side edges of the transparent lid 158 may be deleted.

Figure 6:
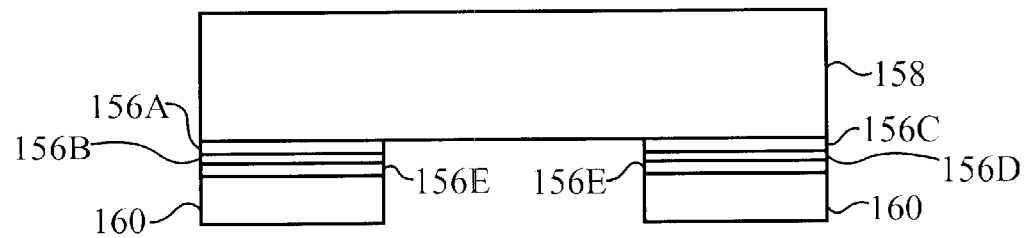
FIG. 6 shows a schematic cross section diagram of an alternate embodiment of the lid according to the present invention with somewhat more detail than FIG. 3.

FIG. 6 shows a cross-section view of another embodiment of the lid and metallization layers. In this embodiment, the solderable material 156 also comprises a sandwich of layers. Here, the solderable layer includes a first layer 156C formed against the transparent lid 158. A second layer 156D is formed over the first layer 156C and a third layer 156E is formed over the second layer 156D. The layer of solder 160 is then formed over the third layer 156E. In this embodiment the first layer 156C is a layer of chrome of about 300 angstroms, the second layer 156D is a layer of nickel of about 500 angstroms and the third layer 156E is a layer of gold of about 10,000 angstroms. The layer of solder 160 is preferably 80 Au/20 Sn solder about 50 microns thick.

Figure 7:
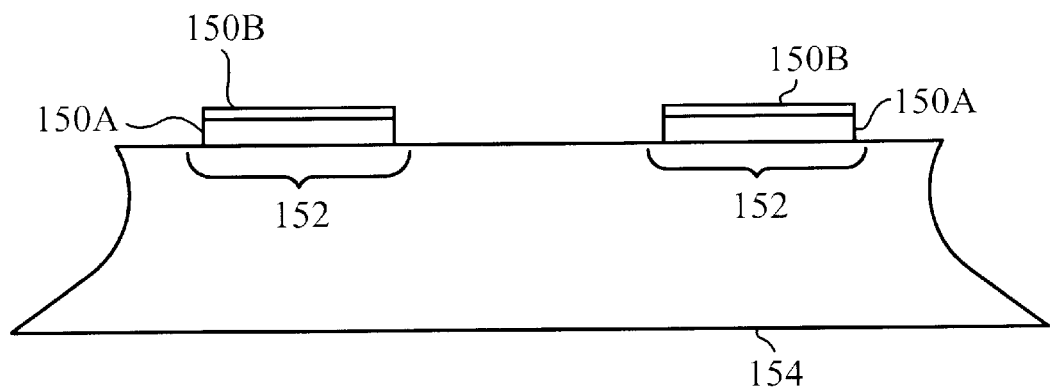
FIG. 7 shows a schematic cross section diagram of the semiconductor device according to the present invention with somewhat more detail than FIG. 3.

FIG. 7 shows a cross-section view of an embodiment of the solderable region 152 of the semiconductor device 154. For simplicity, the active portion of the semiconductor device 154 is not shown. The layer of solderable material is actually formed of a sandwich of layers. The sandwich of layers is formed using conventional lift-off semiconductor processing techniques. In other words, a layer of photo resist is deposited onto the surface of the semiconductor wafer. Using conventional masking techniques, openings are formed through the photo resist. The layers of solderable material are then deposited over the wafer including into the openings formed through the photo resist. Upon removal of the photo resist, the solderable material only remains on the surface of the semiconductor wafer in the lid sealing region 152.

A first layer 150A is formed in the lid sealing region 152 of the semiconductor device 154. A second layer 150B is formed over the first layer 150A. In this embodiment, the first layer 150A is a layer of chrome of about 500 angstroms. The second layer 150B is a layer of palladium of about 1000 angstroms.

Figure 8:
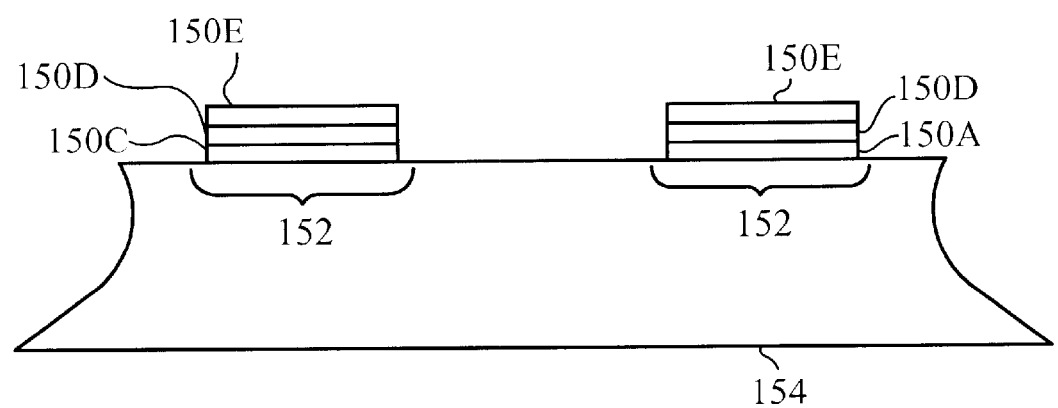
FIG. 8 shows a schematic cross section diagram of an alternate embodiment of the semiconductor device according to the present invention with somewhat more detail than FIG. 3.

FIG. 8 shows a cross-section view of another embodiment of the solderable region 152. In this embodiment, the solderable layer 150 comprises a three layer sandwich. A first layer 150C is formed in the lid sealing region 152 of the semiconductor device 154. A second layer 150D is formed over the first layer 150C and a third layer 150E is formed over the second layer 150D using conventional lift off techniques. In this embodiment, the first layer 150C is a layer of titanium of about 300 angstroms, the second layer 150D is a layer of nickel of about 1000 angstroms and the third layer 150E is a layer of platinum of about 1000 angstroms.

It will be apparent that the angle between the transparent lid 158 and the semiconductor device 154 can affect the optical characteristics of the assembly. For example, optical energy reflecting between the surface of the semiconductor device 154 and the bottom side of the transparent lid 158 can interfere constructively or destructively. There are applications which require the transparent lid 158 and semiconductor device 154 to be parallel and applications which require a predetermined angle between these elements. The present invention also provides uses of this technology and ability to control and select the pre-determined angle between the transparent lid 158 and semiconductor device 154.

Once melted, the solder 160 will flow to all wetted surfaces. However, the surface tension of the solder 160 will be prevented from flowing beyond the boundaries of the solderable layers 150 and 156. Owing to the viscous properties of solder, the solder cannot flow circumferentially around the periphery of a ringed structure such as described in this invention.

Figure 9:
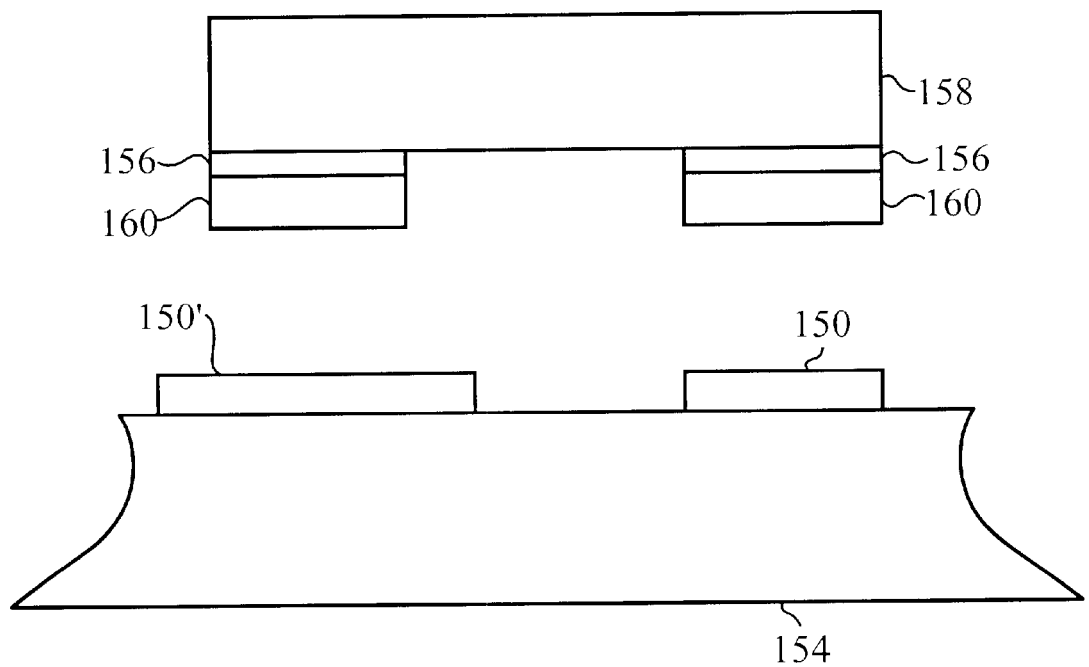
FIG. 9 shows a schematic cross section of an embodiment for generating a predetermined angle of tilt prior to sealing the lid to the semiconductor device.

Because all layers are concurrently formed using conventional semiconductor processing techniques, the thickness of each one of the several layers is uniform throughout each one of the entire layer. To control the relative angle between the transparent lid 158 and semiconductor device 154 the relative width of one side of the solderable layer 150 is adjusted. FIG. 9 shows a simplified cross-section of this embodiment. Recall that the lid sealing region 152 of the semiconductor device 154 is essentially a rectangular ring. The mask for forming the solderable layer 150 is modified along one edge of the rectangular ring to form a wider layer 150'.

Figure 10:
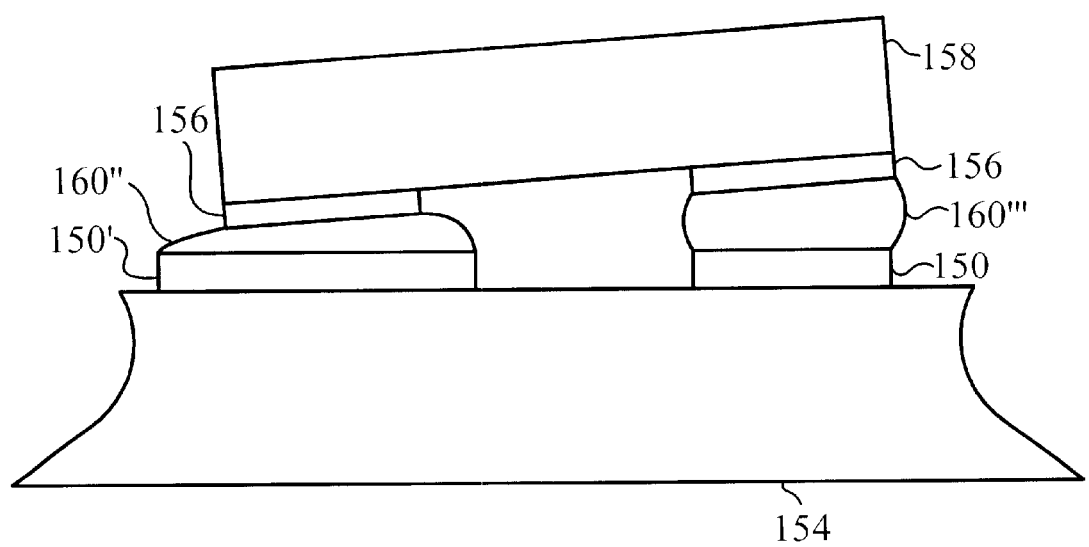
FIG. 10 shows an exaggerated schematic cross section of the embodiment of FIG. 9 tilted in place after the lid is sealed to the semiconductor device.

FIG. 10 shows a cross-section of the embodiment of FIG. 9 once the lid 158 has aligned to the semiconductor device 154 and the assembly is heated to hermetically seal the construction. After the solder 160 is heated beyond melting point it flows to all wetted surfaces. Because the layer 150' is wider than the layer 150, the solder 160" must necessarily spread wider than the solder 160'". Further, because the solder does not flow circumferentially around the periphery of the ringed structure, the transparent lid 158 is closer to the semiconductor device 154 over the wide solderable layer 150' than over the conventional solderable layer 150.

It will be apparent to persons of ordinary skill in the art that the thickness of the resulting solder and hence the angle between the transparent lid 158 and semiconductor device 154 could also be adjusted by modifying the width of the solderable layer 156 which is coupled to the transparent lid 158. The angle could also be adjusted by concurrently modifying the widths of both the solderable layer 150 and its corresponding solderable layer 156. However, because the wafer of semiconductor devices 154 is made with the sequence of wafer masks, and because the lids are individually aligned to the wafer it is easier to adjust the angle by only adjusting the width of the solderable layer 150 as appropriate.

Figure 11:
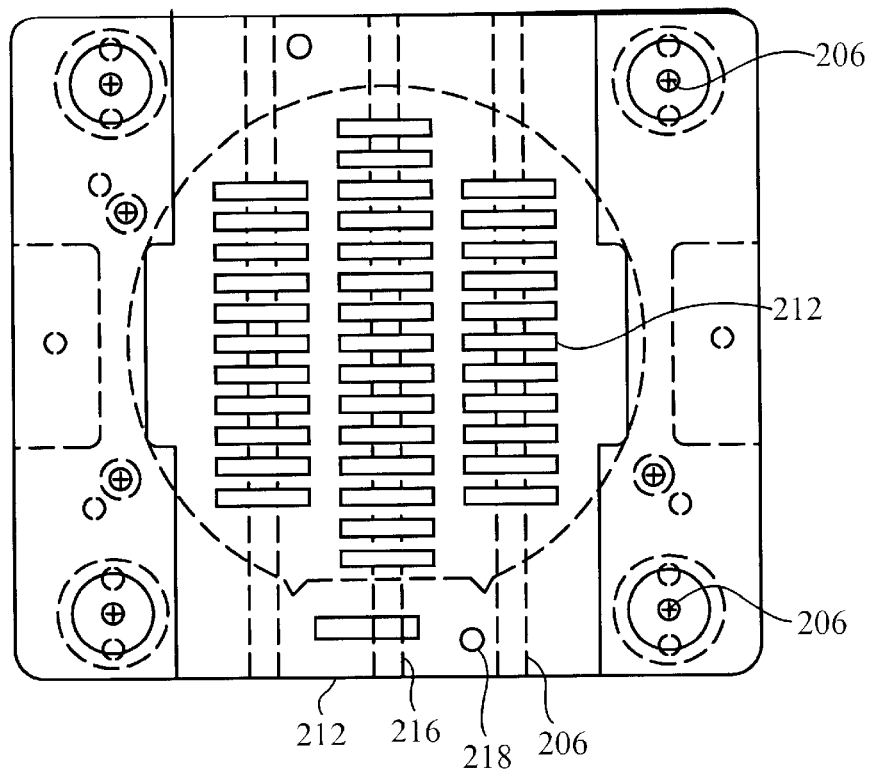
FIG. 11 shows a plan view of a fixture for aligning the lid to the semiconductor device.
Figure 12:
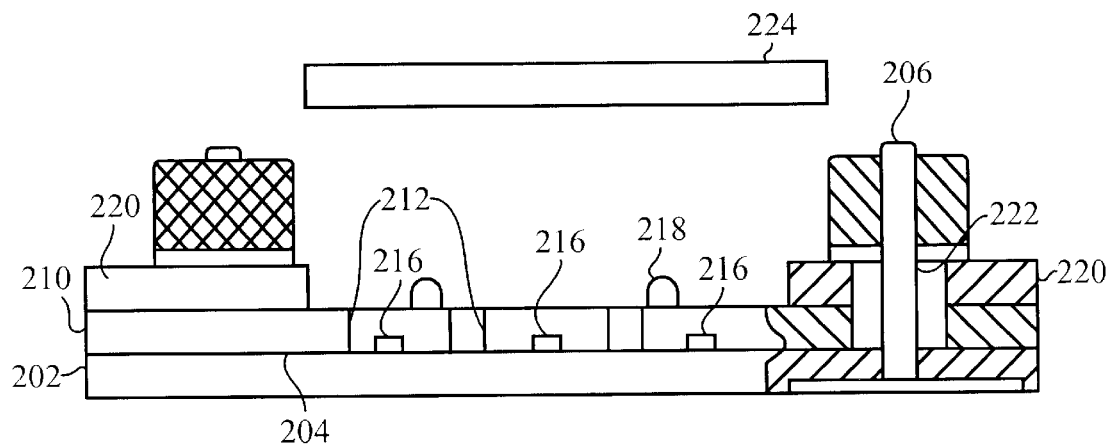
FIG. 12 shows a side view of the fixture of FIG. 11.

FIG. 11 shows a plan view of a fixture 200 for aligning transparent lids to semiconductor devices on a wafer. FIG. 12 shows a side view partially in cross section of the same fixture 200. Common reference numerals will be used to identify identical elements in the FIGS. 11 and 12. The fixture 200 includes a graphite base 202. The base 202 includes a cut-out 204 appropriately sized to accept a semiconductor wafer. Four threaded locking elements 206 (screws) pass upwardly through the base 202 through a plurality of holes 208.

An intermediate plate 210 includes holes 214 aligned to accept the threaded locking elements 206. The intermediate plate 210 also includes thirty-seven apertures 212 sized to accept the transparent lids 158 (FIG. 3). The intermediate plate 210 also includes three channels 216 positioned to allow moisture to escape from the semiconductor devices 154 (FIG. 3) during a subsequent heating operation. Alignment pins 218 are mounted to the base 202 and pass through the intermediate plate 210. A pair of holding plates 220 also include holes 222 which are positioned to accept the threaded locking elements 206.

In use, a wafer is aligned and mounted within the cut-out 204 of the base 202 with the semiconductor devices 154 (FIG. 3) facing away from the base 202. The intermediate plate 210 is then installed to the base 202 over the wafer. A transparent lid 158 is then inserted into each of the apertures 212. It will be apparent that a test operation could be performed on the semiconductor devices 154 while still in the wafer form and bad devices could be marked so that no transparent lid 158 need be sealed to such bad devices. A weighted cap-panel 224 is rested over the transparent lids 158 to apply an appropriate amount of downward pressure owing to gravity.

Once the assembly described relative to FIGS. 11 and 12 is fully constructed it is placed into an environmental chamber. FIG. 13 shows a graph representing temperature in ° C. versus time. FIG. 14 shows a graph representing atmospheric pressure in torr and/or atm versus time. Once the ambient atmosphere is removed, the assembly is exposed to a back fill gas comprising 10% He, 10% H and 80% N at less than 1 ppm water. The two graphs of FIGS. 13 and 14 are displayed in conjunction to a single time line and the process of forming the hermetic seal of the present invention is so described herein.

The assembly is inserted into the environmental chamber with initial conditions of ambient temperature and atmosphere. Immediately, the atmosphere is evacuated to a vacuum pressure of 0.1 torr. This cycle lasts for approximately the first minute. Then the assembly is subjected to a pressure of 2 atm of the back fill gas for about 15 to 30 seconds and then the atmosphere is evacuated to a vacuum pressure of 0.0001 torr. This first evacuation continues and during the evacuation, at about five minutes, the chamber is heated to about 190° C. This is less than the melting point of the solder. This step of heating is to dry all residual moisture from the semiconductor devices 154 (FIG. 3) and also from the lids 158 (FIG. 3) and is known as a drying vacuum bake. During the drying vacuum bake, at about 7.5 minutes, the atmosphere is again evacuated to about 0.0001 torr for about one minute. Thereafter, at about 9.5 minutes, the pressure is increased to 2 atm with the back fill gas. Once the pressure reaches 2 atm, at about 10 minutes, the chamber is heated beyond the melting temperature of the solder and held at that temperature for about 3 minutes. The temperature is then allowed to return to room temperature. After the melting temperature is traversed, so that the solder solidifies and the semiconductor device is hermetic, the air pressure is returned to ambient. The heating steps are undertaken by a radiant heat source, though any other convenient means of heating will suffice.

It will be recalled that layers of solderable material must first be formed so that the solder will appropriately adhere to both the lid and the semiconductor device. There are certain advantages to this. With a MEM, it is important that the lid does not interfere with the free movement of the mechanical MEM structure. The layers of solderable material can be used to increase the distance between the lid and the semiconductor device. However, materials other than solder can be used to seal the lids to the semiconductor devices. The materials for the structures can be appropriately substituted as described below.

A polymeric epoxy ring can be formed in the lid sealing region or around the periphery of the lid, or both. The lid and the semiconductor device are then brought together, heated and cooled to passivate the semiconductor device. Depending upon the thickness of the epoxy layer(s) and its relative viscosity, the lid and the semiconductor device may be sufficiently far apart to avoid having the lid interfere with the operation of the MEM. If simple experimental results indicate otherwise, any suitable material can be first deposited in the lid sealing region, around the periphery of the lid, or both to increase the spacing between the lid and the semiconductor device. The spacing material can be $SiO_2$, for example as that material is readily manufacturable in an conventional semiconductor manufacturing facility.

Another material that can be used in place of the polymeric epoxy is glass frit. But for this substitution, the glass material can be used in the same way as the polymeric epoxy described above.

Figure 15:
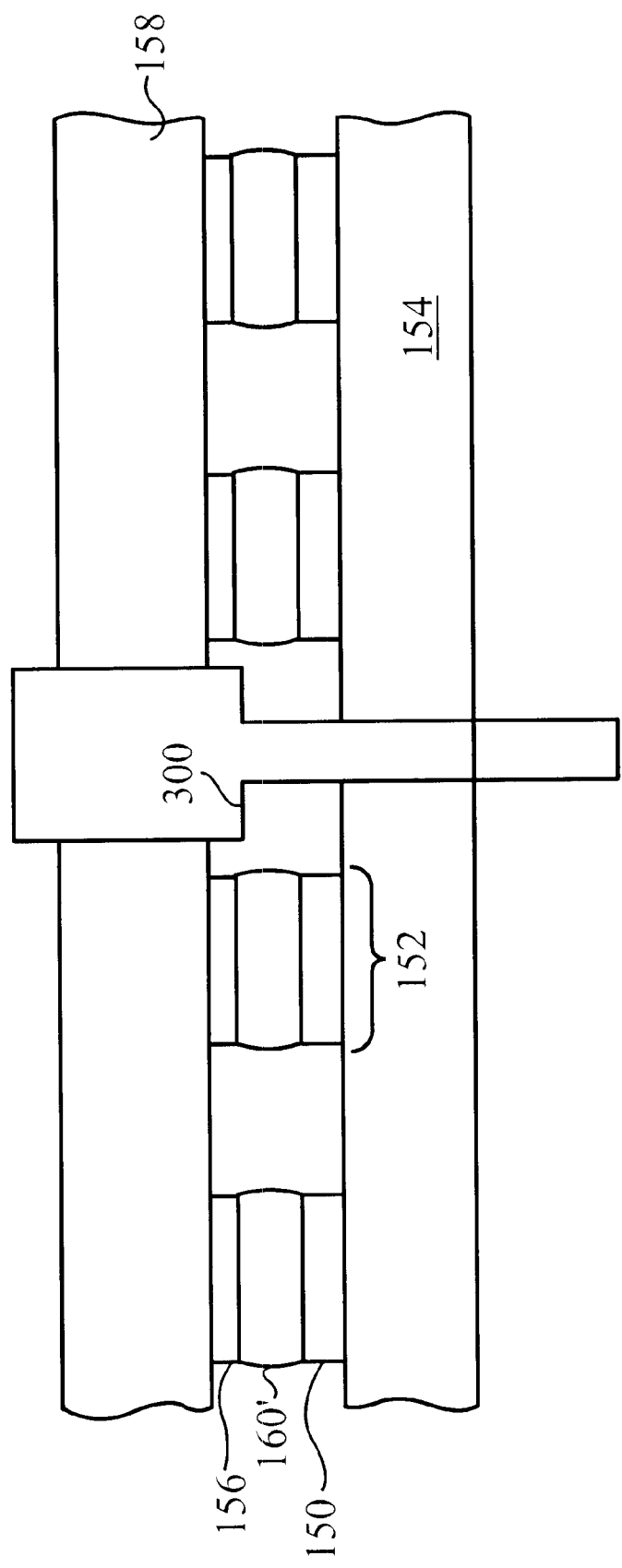
FIG. 15 shows a schematic cross sectional representation of a wafer saw concurrently separating lids and semiconductor devices.

It will be apparent to one of ordinary skill in the art that the lids and their respective rings of solderable layers and overlying layers of solder could be formed on a wafer of transparent material. Then the transparent wafer and the semiconductor wafer need merely be fixtured and aligned before subjecting that combination to the temperature cycling taught in FIGS. 13 and 14. To separate the devices into separate devices, one could simply use a narrow wafer saw blade and cut through the transparent wafer to only a predetermined depth to form individual lids and then in a second operation, use the same narrow blade to separate the semiconductor devices. In an alternate embodiment, a single narrow blade with a berm could be used to separate these devices in a single operation. As shown in FIG. 15, the lids 158 are separated by the berm 300 and the semiconductor devices 154 are concurrently separated by the tip of the saw blade 302.

When the lids 158 are all concurrently formed in a wafer and then brought together with a wafer of semiconductor devices 154, it will be apparent to one of ordinary skill in the art that the semiconductor devices 154 and the lids 158 will necessarily be parallel to one another. To form a predetermined angle between the semiconductor devices 154 and the lids 158, either one or both of the semiconductor devices 154 and the lids 158 can have a non-uniform peripheral region as previously described. Once the semiconductor devices 154 and the lids 158 are initially joined together using one of the techniques described above, the assembly is cut to form individual units. Thereafter, these units can be reheated to allow the seal to flow and provide the desired angle between the semiconductor devices 154 and the lids 158.

The present invention has been described in terms of specific embodiments incorporating details to facilitate the understanding of principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

What is claimed is:

1. A method of forming an hermetic seal to a semiconductor device comprising the steps of:
   a. forming an active semiconductor device on a semiconductor substrate;
   b. forming a lid sealing region surrounding the active semiconductor device, the lid sealing region having passivation spacer layer formed thereon such that the passivation spacer layer surrounds but does not substantially cover the active semiconductor device;
   c. forming means for electrically coupling to the active semiconductor device on the surface of the substrate and outside the lid sealing region;
   d. forming a first layer of solderable material on the passivation spacer layer;
   e. on an optically transparent lid, forming a second layer of solderable material in a pattern conforming to the first layer of solderable material;
   f. aligning the first layer of solderable material to the second layer of solderable material while providing a layer of solder therebetween; and
   g. applying heat to melt the solder and seal the lid to the lid sealing region, wherein the passivation spacer layer is configured to position the lid a finite distance from the active semiconductor device.

2. A method of forming an hermetic seal between a lid and a semiconductor device, wherein the lid and the semiconductor device are not parallel to one another comprising the steps of:
   a. providing an active semiconductor device on a semiconductor substrate;
   b. forming a substantially planarized lid sealing region surrounding the active semiconductor device;
   c. forming means for electrically coupling to the active semiconductor device on the surface of the substrate and outside the lid sealing region;
   d. forming a first layer of solderable material on the lid sealing region;
   e. on an optically transparent lid, forming a second layer of solderable material in a pattern conforming to the first layer of solderable material;
   f. aligning the first layer of solderable material to the second layer of solderable material while providing a layer of solder therebetween; and
   g. applying heat to melt the solder and seal the lid to the lid sealing region, wherein at least one of the first layer of solderable material and the second layer of solderable material has a substantially non-uniform cross section.

3. A method of forming hermetic seal between a lid and a semiconductor device, wherein the lid and the semiconductor device are not parallel to one another comprising the steps of:
   a. providing an active semiconductor device on a semiconductor substrate;
   b. forming a substantially planarized lid sealing region surrounding the active semiconductor device;
   c. forming means for electrically coupling to the active semiconductor device on the surface of the substrate and outside the lid sealing region;
   d. forming a first layer of solderable material on the lid sealing region;
   e. on an optically transparent lid, forming a second layer of solderable material in a pattern conforming to the first layer of solderable material;
   f. aligning the first layer of solderable material to the second layer of solderable material while providing a layer of solder therebetween; and
   g. applying heat to melt the solder and seal the lid to the lid sealing region, wherein at least one of the first layer of solderable material and the second layer of solderable material has a substantially non-uniform cross section around their respective lengths.

4. The method according to claim 3 wherein the lid sealing region and the first layer of solderable material have a substantially rectangular configuration having four legs joined at substantially right angles and one of the legs of the first layer of solderable material has a substantially dissimilar cross sectional area from the other three legs.

5. A method of concurrently forming an hermetic seal to each of a plurality of active semiconductor devices each comprising a plurality of ribbons all formed on a single semiconductor substrate comprising the steps of:
 a. providing the plurality of active semiconductor devices on the semiconductor substrate;
 b. forming a lid sealing region surrounding each of the active semiconductor devices, the lid sealing region having a passivation layer formed thereon such that the passivation spacer aver surrounds but does not substantially cover each of the active semiconductor devices;
 c. forming means for electrically coupling to each of the active semiconductor devices on the surface of the substrate and outside the lid sealing region for each of the active semiconductor devices;
 d. forming a first layer of solderable material on each of the passivation spacer layers;
 e. on an optically transparent wafer, forming a second layer of solderable material in a pattern conforming to the first layer of solderable material;
 f. aligning the first layer of solderable material to the second layer of solderable material while providing a layer of solder therebetween; and
 g. applying heat to melt the solder and seal the wafer to the lid sealing regions,
wherein the passivation spacer layer is configured to position the lid a finite distance from the active semiconductor device.

6. A method of forming an hermetic seal between a transparent wafer and a semiconductor wafer having a plurality of semiconductor devices comprising the steps of:
 a. providing a wafer having a plurality of active semiconductor devices ribbons on a semiconductor substrate;
 b. forming a substantially planarized lid sealing region surrounding each one of the active semiconductor devices;
 c. forming means for electrically coupling to each one of the active semiconductor devices on the surface of the substrate and outside each one of the lid sealing regions;
 d. forming a first layer of solderable material on each one of the lid sealing regions;
 e. on an optically transparent wafer, forming a second layer of solderable material in a pattern conforming to the first layer of solderable material;
 f. aligning the first layer of solderable material to the second layer of solderable material while providing a layer of solder therebetween; and
 g. applying heat to melt the solder and seal the optically transparent wafer to the lid sealing regions,
wherein at least one of the first layer of solderable material and the second layer of solderable material has a substantially non-uniform cross section around their respective lengths.

7. A method of forming an hermetic seal between a plurality of lids from an optically transparent wafer and a wafer of semiconductor devices, wherein at least one of the lids and its respective semiconductor device are not parallel to one another, the method comprising the steps of:
 a. providing a plurality of active semiconductor devices on a semiconductor substrate;
 b. forming a substantially planarized lid sealing region surrounding each one of the active semiconductor devices;
 c. forming means for electrically coupling to each one of the active semiconductor devices on the surface of the substrate and outside each respective one of the lid sealing regions;
 d. concurrently forming a first layer of solderable material on the lid sealing regions;
 e. on an optically transparent wafer, forming a second layer of solderable material in a pattern conforming to the first layer of solderable material;
 f. aligning the first layer of solderable material to the second layer of solderable material while providing a layer of solder therebetween; and
 g. applying heat to melt the solder and seal the wafer to the lid sealing regions,
wherein at least one of the first layer of solderable material and the second layer of solderable material has a substantially non-uniform cross section around their respective lengths;
 h. concurrently separating the semiconductor devices from the lids to form units; and
 i. re-heating the units to provide a non-parallel relationship between the lids and their respective semiconductor devices.

8. The method according to claim 7 wherein the lid sealing region and the first layer of solderable material have a substantially rectangular configuration having four legs joined at substantially right angles and one of the legs of the first layer of solderable material has a substantially dissimilar cross sectional area from the other three legs.

9. A method of forming an hermetic seal to a semiconductor device comprising the steps of:
 a. providing an active semiconductor device on a semiconductor substrate;
 b. forming a lid sealing region on the semiconductor device and surrounding the active semiconductor device, the lid sealing region having a passivation spacer layer formed thereon;
 c. forming means for electrically coupling to the active semiconductor device on the surface of the substrate and outside the lid sealing region;
 d. forming a layer of polymeric epoxy on the passivation spacer layer;
 e. providing a substantially flat optically transparent lid sized to conform to the lid sealing region;
 f. aligning the lid to the layer of polymeric epoxy; and
 g. applying heat to melt the polymeric epoxy and seal the lid to the lid sealing region.

10. The method according to claim 9 further comprising a spacing layer formed between the layer of polymeric epoxy and the display device.

11. The method according to claim 9 further comprising a spacing layer formed between the layer of polymeric epoxy and the lid.

12. A method of forming an hermetic seal to a semiconductor device comprising the steps of:
 a. providing an active semiconductor device on a semiconductor substrate;
 b. forming a lid sealing region surrounding the active semiconductor device, the lid sealing region having a passivation spacer layer formed thereon;

c. forming means for electrically coupling to the active semiconductor device on the surface of the substrate and outside the lid sealing region;
d. forming a layer of glass frit on the passivation spacer layer;
e. providing a substantially flat optically transparent lid sized to conform to the lid sealing region;
f. aligning the lid to the layer of glass frit; and
g. applying heat to melt the glass frit and seal the lid to the lid sealing region, wherein the passivation spacer layer is configured to position the lid a finite distance from the active semiconductor device.

13. The method according to claim 12 further comprising a spacing layer formed between the layer of glass frit and the display device.

14. The method according to claim 12 further comprising a spacing layer formed between the layer of glass frit and the lid.

* * * * *